(12) United States Patent
Choi et al.

(10) Patent No.: US 9,691,638 B2
(45) Date of Patent: Jun. 27, 2017

(54) APPARATUS FOR TREATING SUBSTRATE AND METHOD FOR DISCHARGING SUPERCRITICAL FLUID

(75) Inventors: Yong Hyun Choi, Suwon-si (KR); Kibong Kim, Paju-si (KR); Woo Young Kim, Cheonan-si (KR); Jeong Seon Park, Cheonan-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 1399 days.

(21) Appl. No.: 13/537,960

(22) Filed: Jun. 29, 2012

(65) Prior Publication Data

US 2013/0000144 A1 Jan. 3, 2013

(30) Foreign Application Priority Data

Jun. 30, 2011 (KR) .................. 10-2011-0064988
Oct. 13, 2011 (KR) .................. 10-2011-0104767

(51) Int. Cl.
| | | |
|---|---|---|
| F26B 25/06 | (2006.01) | |
| F26B 7/00 | (2006.01) | |
| H01L 21/67 | (2006.01) | |

(52) U.S. Cl.
CPC ... H01L 21/67017 (2013.01); Y10T 137/1189 (2015.04)

(58) Field of Classification Search
CPC .............. H01L 21/67017; Y10T 137/1189
See application file for complete search history.

(56) References Cited

U.S. PATENT DOCUMENTS

| | | | |
|---|---|---|---|
| 2002/0195130 A1* | 12/2002 | Twu .................. | H01L 21/67034 134/61 |
| 2003/0208922 A1* | 11/2003 | Hsu .................. | H01L 21/67034 34/468 |
| 2004/0011386 A1 | 1/2004 | Seghal | |
| 2005/0079107 A1 | 4/2005 | Muraoka et al. | |
| 2007/0259766 A1* | 11/2007 | Jackson ............... | B08B 3/06 494/36 |
| 2011/0056913 A1* | 3/2011 | Mayer .................. | C23F 1/08 216/84 |
| 2011/0314689 A1* | 12/2011 | Okuchi ............... | C11D 11/0047 34/357 |
| 2012/0048304 A1* | 3/2012 | Kitajima ........... | H01L 21/67034 134/30 |

FOREIGN PATENT DOCUMENTS

| | | |
|---|---|---|
| CN | 1385882 A | 12/2002 |
| CN | 101103181 A | 1/2008 |

(Continued)

*Primary Examiner* — Michael Barr
*Assistant Examiner* — Benjamin L Osterhout
(74) *Attorney, Agent, or Firm* — Harness, Dickey & Pierce, PLC

(57) ABSTRACT

Provided are an apparatus for treating a substrate and a method for discharge a supercritical fluid, and more particularly, an apparatus for treating a substrate using a supercritical fluid and a method for discharging the supercritical fluid using the same. The apparatus for treating the substrate includes a container for providing a supercritical fluid, a vent line through which the supercritical fluid is discharged from the container, and a freezing prevention unit disposed in the vent line to prevent the supercritical fluid from being frozen.

23 Claims, 28 Drawing Sheets

(56) References Cited

FOREIGN PATENT DOCUMENTS

| | | |
|---|---:|---:|
| CN | 101144678 A | 3/2008 |
| JP | 2000-340540 A | 12/2000 |
| JP | 2006-194157 | 7/2006 |
| JP | 2006-294662 | 10/2006 |
| JP | 2007-152195 | 6/2007 |
| JP | 2007-157873 | 6/2007 |
| JP | 2009-194092 | 8/2009 |
| KR | 2004-0058207 A | 7/2004 |
| KR | 10-0822373 B1 | 3/2008 |
| KR | 10-2010-0077888 | 7/2010 |

* cited by examiner

|  | IPA Separation Rate |
|---|---|
| 30 ℃ | 48.95% |
| 20 ℃ | 42.8% |
| 10 ℃ | 38.8% |

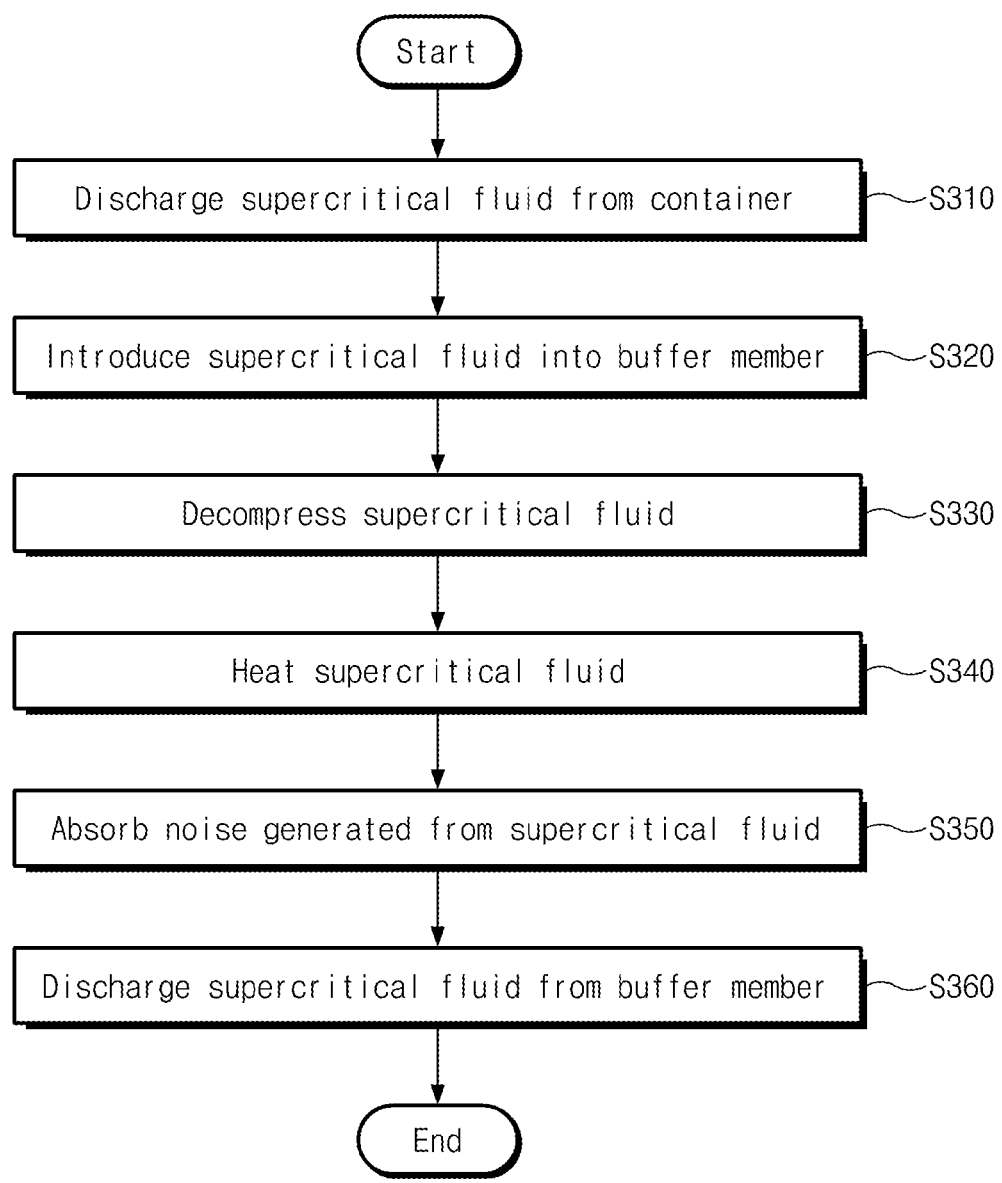

APPARATUS FOR TREATING SUBSTRATE AND METHOD FOR DISCHARGING SUPERCRITICAL FLUID

CROSS-REFERENCE TO RELATED APPLICATIONS

This U.S. non-provisional patent application claims priority under 35 U.S.C. §119 of Korean Patent Application Nos. 10-2011-0064988, filed on Jun. 30, 2011, and 10-2011-0104767, filed on Oct. 13, 2011, the entire contents of which are hereby incorporated by reference.

BACKGROUND OF THE INVENTION

The present invention herein relates to an apparatus for treating a substrate and a method for discharging a supercritical fluid, and more particularly, to an apparatus for treating a substrate using a supercritical fluid and a method for discharging the supercritical fluid using the same.

Semiconductor devices are manufactured through various processes including a photolithography process for forming circuit patterns on a substrate such as a silicon wafer or the like. When the semiconductor devices are manufactured, various foreign substances such as particles, organic contaminants, metal impurities, and the like may be generated. The foreign substances may cause substrate defects to directly exert a bad influence on yield of semiconductor devices. Thus, a cleaning process for removing the foreign substances may be essentially involved in a semiconductor manufacturing process.

Generally, in a typical cleaning process, foreign substances remaining on a substrate are removed using detergent and then the substrate is cleaned using deionized water (DI-water) to dry the cleaned substrate using isopropyl alcohol (IPA). However, the drying process may have low efficiency in a case where a semiconductor device has fine circuit patterns. In addition, since damage of the circuit patterns, i.e., pattern collapse frequently occurs during the drying process, the drying process is unsuitable for a semiconductor device having a line width of about 30 nm or less.

Thus, to solve the above-described limitation, studies about technologies for drying a substrate using a supercritical fluid are actively being carried out.

SUMMARY OF THE INVENTION

The present invention provides an apparatus for treating a substrate which prevents a supercritical fluid from be frozen when the supercritical fluid is discharged and a method for discharging the supercritical fluid.

The present invention also provides an apparatus for treating a substrate which removes noises generated when a supercritical fluid is discharged and a method for discharging the supercritical fluid.

The feature of the present invention is not limited to the aforesaid, but other features not described herein will be clearly understood by those skilled in the art from this specification and the accompanying drawings.

The prevent invention provides an apparatus for treating a substrate and a method for discharge a supercritical fluid.

Embodiments of the present invention provide apparatuses for treating a substrate, the apparatuses including: a container for providing a supercritical fluid; a vent line through which the supercritical fluid is discharged from the container; and a freezing prevention unit disposed in the vent line to prevent the supercritical fluid from being frozen.

In some embodiments, the freezing prevention unit may include a buffer member providing a buffer space for preventing the supercritical fluid from suddenly dropping in pressure.

In other embodiments, the buffer member may include: a housing providing the buffer space; an inflow tube through which the supercritical fluid is introduced into the buffer space; a discharge tube through which the supercritical fluid is discharged from the buffer space; and at least one partition wall disposed within the housing to have a plane perpendicular to a length direction to partition the buffer space into a plurality of spaces in which the supercritical fluid gradationally drops in pressure.

In still other embodiments, a vent hole may be defined in the at least one partition wall, and the vent holes defined in the partition walls adjacent to each other may be defined in positions different from each other when viewed in the length direction of the housing.

In even other embodiments, the vent hole of the partition wall adjacent to the inflow tube may be defined in a position different from that at which the inflow tube is disposed when viewed in the length direction of the housing, and the vent hole of the partition wall adjacent to the exhaust tube may be defined in a position different from that at which the exhaust tube is disposed when viewed in the length direction of the housing.

In yet other embodiments, the freezing prevention unit may further include a heater for heating the supercritical fluid.

In further embodiments, the heater may be disposed in the housing.

In still further embodiments, the buffer member may further include a sound absorption member disposed within the housing to absorb a noise generated from the supercritical fluid.

In even further embodiments, the sound absorption member may have a wire mesh structure which interrupts a flow of the supercritical fluid to prevent the supercritical fluid from suddenly dropping in pressure.

In yet further embodiments, the inflow tube may have one end connected to the vent line and the other end inserted into the housing along the length direction of the housing, and an inflow hole through which the supercritical fluid is discharged may be defined in a portion, in which the inflow tube is inserted into the housing, in a direction perpendicular to the length direction of the housing.

In much further embodiments, the buffer member may include a reverse pressure regulator disposed in the discharge tube to constantly maintain a pressure within the buffer space.

In still much further embodiments, the freezing prevention unit may include a heater disposed in the vent line.

In even much further embodiments, the container may include a process chamber in which a drying process is performed using the supercritical fluid.

In yet much further embodiments, the container may include a water supply tank for supplying the supercritical fluid into a process chamber in which a drying process is performed using the supercritical fluid.

In much still further embodiments, the freezing prevention unit may be provided in plurality, and the plurality of freezing prevention unit may be connected to each other in series.

In other embodiments of the present invention, methods for discharging a supercritical fluid from a container include providing a buffer space in a vent line connected to the container to discharge the supercritical fluid to prevent the supercritical fluid from suddenly dropping in pressure, thereby preventing the supercritical fluid from being frozen.

In some embodiments, the supercritical fluid may be heated during the discharge of the supercritical fluid.

In other embodiments, a sound absorption member may be provided to the supercritical fluid passing through the buffer space to absorb a noise generated from the supercritical fluid.

In still other embodiments, the supercritical fluid may be discharged from a process chamber in which a drying process is performed using the supercritical fluid.

In even other embodiments, the supercritical fluid may be discharged from a water supply tank for supplying the supercritical fluid into a process chamber in which a drying process is performed using the supercritical fluid.

In still other embodiments of the present invention, apparatuses for treating a substrate include: a process chamber in which a drying process is performed using a fluid which is provided as a supercritical fluid; a storage tank storing the fluid; a water supply tank receiving the fluid from the storage tank to produce the supercritical fluid and provide the supercritical fluid into the process chamber; a vent line connected to at least one of the process chamber and the water supply tank to discharge the supercritical fluid; and a freezing prevention unit disposed in the vent line to prevent the supercritical fluid from being frozen.

In some embodiments, the freezing prevention unit may include a buffer member providing a buffer space for preventing the supercritical fluid from suddenly dropping in pressure.

In other embodiments, the buffer member may include a sound absorption member absorbing a noise generated from the supercritical fluid.

In still other embodiments, the freezing prevention unit may include a heater for heating the supercritical fluid.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings:

FIG. 30 is a flowchart illustrating a process for discharging a supercritical fluid according to an embodiment of the present invention.

DETAILED DESCRIPTION OF PREFERRED EMBODIMENTS

Preferred embodiments of the present are provided so that this disclosure will be thorough and complete, and will fully convey the scope of the present invention to those skilled in the art. The present invention may, however, be embodied in different forms and should not be constructed as limited to the embodiments set forth herein. Thus, it will be apparent to those skilled in the art that various modifications and variations can be made in the present invention without departing form the spirit or scope of the invention.

It will also be understood that although specific terms are used and drawings are attached herein to easily describe the exemplary embodiments of the present invention, the present invention is not limited by these terms and the attached drawings.

Moreover, detailed descriptions related to well-known functions or configurations will be ruled out in order not to unnecessarily obscure subject matters of the present invention.

An apparatus 100 for treating a substrate according to the present invention may be an apparatus for performing a cleaning process on a substrata S.

Here, it should be understood as a comprehensive concept that the substrate S can include various wafers including silicon wafers, glass substrates, organic substrates, and the like, as well as, substrates used for manufacturing semiconductor devices, displays, products including a thin film on which a circuit is formed, and the like.

Hereinafter, an apparatus 100 for treating a substrate according to an embodiment will be described.

Figure 1:
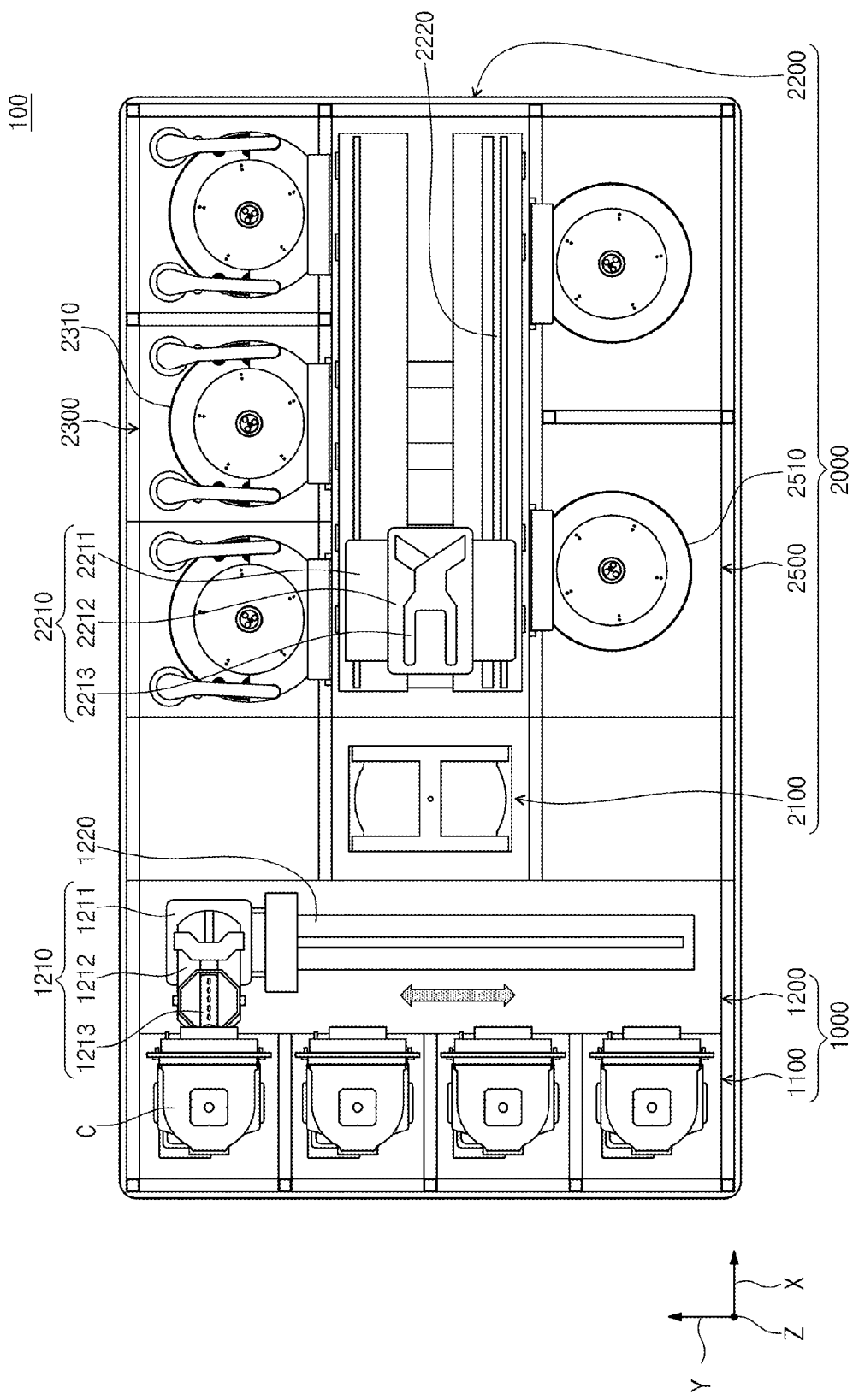
FIG. 1 is a plan view of an apparatus for treating a substrate according to an embodiment of the present invention.

FIG. 1 is a plan view of the apparatus 100 for treating a substrate according to an embodiment of the present invention.

The apparatus 100 for treating a substrate includes an index module 1000, a process module 2000, a supercritical fluid supply unit 3000, a recycling unit 4000, and a freezing prevention unit 5000. The index module 1000 receives a substrate S from the outside to provide the substrate S into the process module. The process module 2000 performs a cleaning process on the substrate S. The supercritical fluid supply unit 3000 supplies a supercritical fluid to be used for the cleaning process, and the recycling unit 4000 recycles the supercritical fluid used in the cleaning process. The freezing prevention unit 5000 prevents the supercritical fluid discharged from the process module 2000, the supercritical fluid supply unit 3000, and the recycling unit 4000 from being frozen.

The index module 1000 may be an equipment front end module (EFEM). Also, the index module 1000 includes a load port 1100 and a transfer frame 1200. The load port 1100, the transfer frame 1200, and the process module 2000 may be successively arranged in a line. Here, an arranged direction of the load port 1100, the transfer frame 1200, and the process module 2000 is referred to as a first direction X. Also, when viewed from an upper side, a direction perpendicular to the first direction X is referred to as a second direction Y, and a direction perpendicular to the first direction X and the second direction Y is referred to as a third direction Z.

At least one load port 1100 may be provided in the index module 1000. The load port 1100 is disposed on a side of the transfer frame 1200. When the load port 1100 is provided in plurality, the load ports 1100 may be arranged in a line along the second direction Y. The number and arrangement of load ports 1100 are not limited to the above-described example. For example, the number and arrangement of load ports 1100 may be adequately selected in consideration of a foot print of the apparatus 100 for treating a substrate, process efficiency, and a relative arrangement with respect to other apparatuses 100 for treating a substrate.

A carrier C in which the substrate C is received is disposed on the load port 1100. The carrier C is transferred from the outside and then loaded on the load port 1100, or is unloaded from the load port 1100 and then transferred into the outside. For example, the carrier C may be transferred between the apparatuses 100 for treating a substrate by a transfer unit such as an overhead hoist transfer (OHT). Here, the substrate S may be transferred by the other transfer unit such as an automatic guided vehicle, a rail guided vehicle, or the like instead of the OHT, or a worker.

The substrate S is received into the carrier C. A front opening unified pod (FOUP) may be used as the carrier C.

At least one slot for supporting an edge of the substrate S may be provided within the carrier C. When the slot is provided in plurality, the slots may be spaced apart from each other along the third direction Z. Thus, the substrate S may be placed within the carrier C. For example, the carrier C may receive twenty-five substrates S.

The inside of the carrier C may be isolated from the outside by an openable door and thus be sealed. Thus, it may prevent the substrate S received in the carrier C from being contaminated.

The transfer frame 1200 transfers the substrate S between the carrier C seated on the load port 1100 and the process module 2000. The transfer module 1200 includes an index robot 1210 and an index rail 1220.

The index rail 1220 provides a movement path of the index robot 1210. The index rail 1220 may be disposed so that a length direction thereof is parallel to the second direction Y.

The index robot 1210 transfers the substrate S. The index robot 1210 may include a base 1211, a body 1212, and an arm 1213.

The base 1211 is disposed on the index rail 1220. Also, the base 1211 may be moved along the index rail 1220. The body 1212 is coupled to the base 1211. Also, the body 1212 may be moved along the third direction Z on the base 1211 or rotated around an axis defined in the third direction Z. The arm 1213 is disposed on the body 1212. Also, the arm 1213 may be moved forward and backward. A hand may be disposed on an end of the arm 1213 to pick up or place the substrate S. The index robot 1210 may include at least one arm 1213. When the arm 1213 is provided in plurality, the arms 1213 may be stacked on the body 1212 and arranged in the third direction Z. Here, the arms 1213 may be independently operated.

Thus, in the index robot 1210, the base 1211 may be moved in the second direction Y on the index rail 1220. Also, the index robot 1210 may take the substrate S out of the carrier C to transfer the substrate S into the process module 2000 or take the substrate S out of the process module 2000 to receive the substrate S into the carrier C according to operations of the body 1212 and the arm 1213.

The index rail 1220 may be omitted in the transfer frame 1200, and the index robot 1210 may be fixed to the transfer frame 1200. In this case, the index robot 1210 may be disposed on a central portion of the transfer frame 1200.

The process module 2000 receives the substrate S from the index module 1000 to perform the cleaning process on the substrate S. The process module 2000 includes a buffer chamber 2100, a transfer chamber 2200, a first process chamber 2300, and a second process chamber 2500. The buffer chamber 2100 and the transfer chamber 2200 are disposed along the first direction X, and the transfer chamber 2200 is disposed so that a length direction thereof is parallel to the first direction X. The process chambers 2300 and 2500 may be disposed on a side surface of the transfer chamber 2200 in the second direction Y.

Here, the first process chamber 2300 may be disposed on one side of the transfer chamber 2200 in the second direction Y, and the second process chamber 2500 may be disposed on the other side opposite to the one side on which the first process chamber is disposed. The first process chamber 2300 may be provided in one or plurality. When the plurality of first process chambers 2300 are provided, the first process chambers 2300 may be disposed on one side of the transfer chamber 2200 along the first direction X, stacked along the third direction Z, or disposed in combination thereof. Similarly, the second process chamber 2500 may be provided in one or plurality. When the plurality of second process chambers are provided, the second process chambers may be disposed on the other side of the transfer chamber 2500 along the first direction X, stacked along the third direction Z, or disposed in combination thereof.

However, the arrangement of each of the chambers in the process module 2000 is not limited to the above-described example. That is, the chambers may be adequately disposed in consideration of process efficiency. For example, as necessary, the first and second process chambers 2300 and 2500 may be disposed along the first direction X on the same side surface as the transfer module 2200 or stacked on each other.

The buffer chamber 2100 is disposed between the transfer frame 1200 and the transfer chamber 2200 to provide a buffer space in which the substrate S transferred between the index module 1000 and the process module 2000 is temporarily stayed. At least one buffer slots on which the substrate S is placed may be provided within the buffer chamber 2100. When the buffer slot is provided in plurality, the buffer slots may be spaced apart from each other along the third direction Z.

The substrate taken out of the carrier C by the index robot 1210 may be seated on the buffer slot, or the substrate C transferred from the process chambers 2300 and 2500 by the transfer robot 2210 of the transfer chamber 2200 may be seated on the buffer slot. On the other hand, the index robot 1210 or the transfer robot 2210 may take the substrate S out of the buffer slot to receive the substrate S into the carrier C or transfer the substrate S into the process chambers 2300 and 2500.

The transfer chamber 2200 transfers the substrate S between the chambers 2100, 2300, and 2500 disposed therearound. The buffer chamber 2100 may be disposed on one side of the transfer chamber 2200 in the first direction X. The process chambers 2300 and 2500 may be disposed on one side or both sides of the transfer chamber 2200 in the second direction Y. Thus, the transfer chamber 2200 may transfer the substrate S between the buffer chamber 2100, the first process chamber 2300, and the second process chamber 2500.

The transfer chamber 2200 includes a transfer rail 2220 and a transfer robot 2210. The transfer rail 2220 provides a movement path of the transfer robot 2210. The transfer rail 2220 may be disposed parallel to the first direction X. The transfer robot 2210 transfers the substrate S. The transfer robot 2210 includes a base 2211, a body 2212, and an arm 2213. Since each of the components of the transfer robot 2210 is similar to each of those of the index robot 1210, their detailed description will be omitted. The transfer robot 2210 transfers the substrate S between the buffer chamber 2100, the first process chamber 2300, and the second process chamber 2500 by the operations of the body 2212 and the arm 2213 while the base 2211 is moved along the transfer rail 2220.

The first and second process chambers 2300 and 2500 may perform processes different from each other on the substrate S. Here, a first process performed in the first process chamber 2300 and a second process performed in the second process chamber 2500 may be successively performed. For example, a chemical process, a cleaning process, and a first drying process may be performed in the first process chamber 2300. Also, a second drying process that is a subsequent process of the first process may be performed in the second process chamber 2500. Here, the first drying process may be a wet drying process performed using an organic solvent, and the second drying process may be a supercritical drying process performed using a supercritical fluid. As necessary, only one of the first and second drying processes may be selectively performed.

Figure 2:
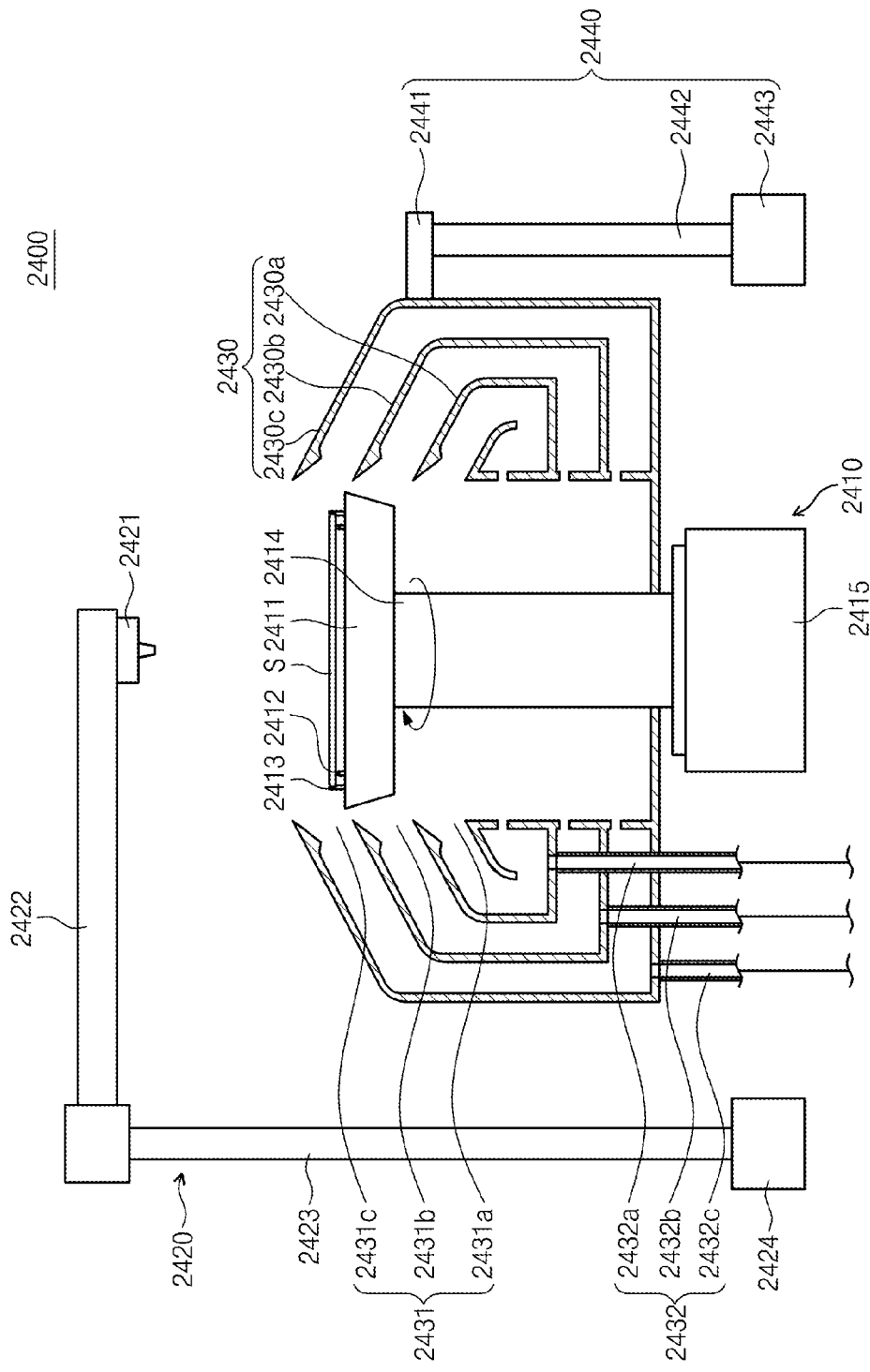
FIG. 2 is a sectional view of a first process chamber of FIG. 1.

Hereinafter, the first process chamber 2300 will be described. FIG. 2 is a sectional view of the second process chamber 2300 of FIG. 1.

The first process is performed in the first process chamber 2300. Here, the first process may include at least one of the chemical process, the cleaning process, and the first drying process. As described above, the first drying process may be omitted.

The first process chamber 2300 includes a housing 2310 and a process unit 2400. The housing 2310 defines an outer wall of the first process chamber 230, and the process unit 2400 is disposed within the housing 2310 to perform the first process.

The process unit 2400 includes a spin head 2410, a fluid supply member 2420, a recovery container 2430, and an elevation member 2440.

The substrate S is seated on the spin head 2410. Also, the spin head 2410 rotates the substrate S during the progression of the processes. The spin head 2410 may include a support plate 2411, support pins 2412, chucking pins 2413, a rotation shaft 2414, and a motor 2415.

The support plate 2411 has an upper portion having a shape similar to that of the substrate S. That is, the upper portion of the support plate 2411 may have a circular shape. The plurality of support pins 2412 on which the substrate S is placed and the plurality of chucking pins 2413 for fixing the substrate S are disposed on the support plate 2411. The rotation shaft 2414 rotated by the motor 2415 is fixed and coupled to a bottom surface of the support plate 2411. The motor 2415 generates a rotation force using an external power source to rotate the support plate 2411 through the rotation shaft 2414. Thus, the substrate S may be seated on the spin head 2410, and the support plate 2411 may be rotated to rotate the substrate during the progression of the first process.

Each of the support pins 2412 protrudes from a top surface of the support plate 2411 in the third direction Z. The plurality of support pins 2412 are disposed spaced a preset distance apart from each other. When viewed from an upper side, the support pins 2412 may be arranged in a circular ring shape. A back surface of the substrate S may be placed on the support pins 2412. Thus, the substrate S is seated on the support pins 2412 so that the substrate S is spaced a protruding distance of each of the support pins 2412 apart from the top surface of the support plate 2411 by the support pins 2412.

Each of the chucking pins 2413 may further protrude from the top surface of the support plate 2411 than each of the support pins 2412 in the third direction Z. Thus, the chucking pins 2413 may be disposed farther away from a center of the support plate 2411 than the support pins 2412. The chucking pins 2413 may be moved between a fixed position and a pick-up position along a radius direction of the support plate 2411. Here, the fixed position represents a position spaced a distance corresponding to a radius of the substrate S from the center of the support plate 2411, and the pick-up position represents a position away from the center of the support plate 2411 than the fixed position. The chucking pins 2413 are disposed at the pick-up position when the substrate S is loaded on the spin head 2410 by the transfer robot 2210. When the substrate S is loaded and then the process is performed, the chucking pins 2413 may be moved to the fixed position to contact a side surface of the substrate S, thereby fixing the substrate S in a regular position. Also, when the process is finished and then the transfer robot 2210 picks the substrate S up to unload the substrate S, the chucking pins 2413 may be moved again to the pick-up position. Thus, the chucking pins 2413 may prevent the substrate S from being separated from the regular position by the rotation force when the spin head 2410 is rotated.

The fluid supply member 2420 supplies a fluid onto the substrate S. The fluid supply member 2420 may include a nozzle 2421, a support 2422, a support shaft 2423, and a driver 2424. The support shaft 2423 is disposed so that a length direction thereof is parallel to the third direction Z. The driver 2424 is coupled to a lower end of the support shaft 2423. The driver 2424 rotates the support shaft 2423 or vertically moves the support shaft 2423 along the third direction Z. The support 2422 is vertically coupled to an upper portion of the support shaft 2423. The nozzle 2421 is disposed on a bottom surface of an end of the support 2422. The nozzle 2421 may be moved between a process position and a standby position by the rotation and elevation of the support shaft 2423 through the driver 2424. Here, the process position represents a position at which the nozzle 2421 is disposed directly above the support plate 2411, and the standby position represents a position at which the nozzle 2421 is disposed deviational from the direct upper side of the support plate 2411.

At least one fluid supply member 2420 may be provided in the process unit 2400. When the fluid supply member 2420 is provided in plurality, the fluid supply members 2420 may supply fluids different from each other, respectively. For example, each of the plurality of fluid supply members 2420 may supply a detergent, a rinsing agent, or an organic solvent. Here, the detergent may include a hydrogen peroxide ($H_2O_2$) solution, a solution in which ammonia ($NH_4OH$), hydrochloric acid (HCl), and sulfuric acid (H2SO4) are mixed with the hydrogen peroxide ($H_2O_2$) solution, or hydrofluoric acid (HF) solution. Deionized water may be mainly used as the rinsing agent. The organic solvent may include isopropyl alcohol, ethyl glycol, 1-propanol, tetra hydraulic franc, 4-hydroxyl, 4-methyl, 2-pentanone, 1-butanol, 2-butanol, methanol, ethanol, n-propyl alcohol, or dimethylether. For example, a first fluid supply member 2420a may spray the ammonia hydrogen peroxide solution, the second fluid supply member may spray the deionized water, and the third fluid supply member 2420c may spray the isopropyl alcohol solution. However, the organic solvent may be not in a liquid state, but in a gaseous state. If the organic solvent is provided in the gaseous state, the organic solvent may be mixed with an inert gas.

When the substrate S is seated on the spin head 2410, the fluid supply member 2420 may be moved from the standby position to the process position to supply the above-described fluid onto the substrate S. For example, the fluid supply member 2420 may supply the detergent, the rinsing agent, and the organic solvent to perform the chemical process, the cleaning process, and the first drying process, respectively. As described above, the spin head 2410 may be rotated by the motor 2415 to uniformly supply the fluids onto a top surface of the substrate S during the progression of the processes.

The recovery container 2430 provides a space in which the first process is performed. Also, the recovery container 2430 recovers the fluid used for the first process. When viewed from an upper side, the recovery container 2430 is disposed around the spin head 2410 to surround the spin head 2410 and has an opened upper side. At least one recovery container 2430 may be provided in the process unit 2400. Hereinafter, the process unit 2400 including three recovery containers 2430, i.e., a first recovery container 2430a, a second recovery container 2430b, and a third recovery container 2430c will be described. However, the number of recovery containers 2430 may be differently selected according to the number of fluids and conditions of the first process.

Each of the first, second, and third recovery containers 2430a, 2430b, and 2430c may have a circular ring shape to surround the spin head 2410. Also, the first, second, and third recovery containers 2430a, 2430b, and 2430c may be disposed away from a center of the spin head 2410 in an order of the first recovery container 2430a, the second recovery container 2430b, and the third recovery container 2430c. That is, the first recovery container 2430a surrounds the spin head 2410, the second recovery container 2430b surrounds the first recovery container 2430a, and the third recovery container 2430c surrounds the second recovery container 2430b. Thus, inflow holes 2431 may be arranged in the third direction Z.

The first recovery container 2430a has a first inflow hole 2431a defined by an inner space thereof. The second recovery container 2430b has a second inflow hole 2431b defined by a space between the first recovery container 2430a and the second recovery container 2430b. The third recovery container 2430c has a third recovery container 2430c defined by a space between the second recovery container 2430b and the third recovery container 2430c. A recovery line 2432 extending downward along the third direction Z is connected to a bottom surface of each of the first, second, and third recovery container 2430a, 2430b, and 2430c. Each of the first, second, and third recovery lines 2432a, 2432b, and 2432c discharges the fluids recovered into the first, second, and third recovery container 2430a, 2430b, and 2430c to supply the fluids into an external fluid recycling system (not shown). The fluid recycling system (not shown) may recycle the recovered fluids to reuse the fluids.

The elevation member 2440 moves the recovery container 2430 in the third direction Z. Thus, the recovery container 2430 may be changed in relative height with respect to the spin head 2410. When the recovery container 2430 is provided in plurality, the inflow hole 2431 of one recovery container 2430 may be selectively adjusted in height so that the inflow hole 2431 is disposed on a horizontal plane of the substrate S seated on the spin head 2410.

The elevation member 2440 includes a bracket 2441, an elevation shaft 2442, and an elevator 2443. The bracket 2441 is fixed to the recovery container 2430. The bracket 2441 has one end fixed and coupled to the elevation shaft 2442 moved in the third direction Z by the elevator 2443. When the recovery container 2430 is provided in plurality, the bracket 2441 may be coupled to the outermost recovery container 2430.

When the substrate S is loaded on the spin head 2410 or unloaded from the spin head 2410, the elevation member 2440 may move the recovery container 2430 downward to prevent the recovery container 2430 from interfering with a path of the transfer robot 2210 for transferring the substrate S.

Also, when a fluid is supplied by the fluid supply member 2420 and the spin head 2410 is rotated to perform the first process, the elevation member 2440 may move the recovery container 2430 in the third direction Z to locate the inflow hole 2431 of the recovery container 2430 on the same horizontal plane as the substrate S so that the fluid bouncing from the substrate S by a centrifugal force due to the rotation of the substrate S is recovered. For example, in a case where the first process is performed in an order of the chemical process by the detergent, the cleaning process by the rinsing agent, and the first drying process by the organic solvent, the first, second, and third inflow holes 2431a, 2431b, and 2431c may be moved to the same horizontal plane as the substrate S to recovery the fluids into the first, second, and third recovery containers 2430a, 2430b, and 2430c when the detergent, the rinsing agent, and the organic solvent are supplied, respectively. As described above, when the used fluids are recovered, environmental pollution may be prevented, and also, the expensive fluids may be recycled to reduce the semiconductor manufacturing costs.

The elevation member 2440 may move the spin head 2410 in the third direction Z, instead of moving the recovery container 2430.

Hereinafter, the second process chamber will be described.

The second process is performed in the second process chamber 2500. Here, the second process may be a second drying process for drying the substrate S using a supercritical fluid.

The supercritical fluid represents a fluid in a state in which a material exceeds a critical temperature and a critical pressure, i.e., a material is not classified into liquid and gaseous states by reaching a critical state. The supercritical fluid has a molecular density similar to that of liquid and viscosity similar to that of gas. Since the supercritical fluid has very high diffusion, penetration, and dissolution, the supercritical fluid has an advantage of chemical reaction. Also, since the supercritical fluid does not exert an interface tension to a fine structure due to a very low surface tension thereof, drying efficiency may be superior when the semiconductor device is dried, and pattern collapse may be prevented.

Hereinafter, a supercritical fluid of carbon dioxide ($CO_2$) mainly used for drying the substrate S will be described. However, the present invention is not limited to components and kinds of the supercritical fluid.

Figure 3:
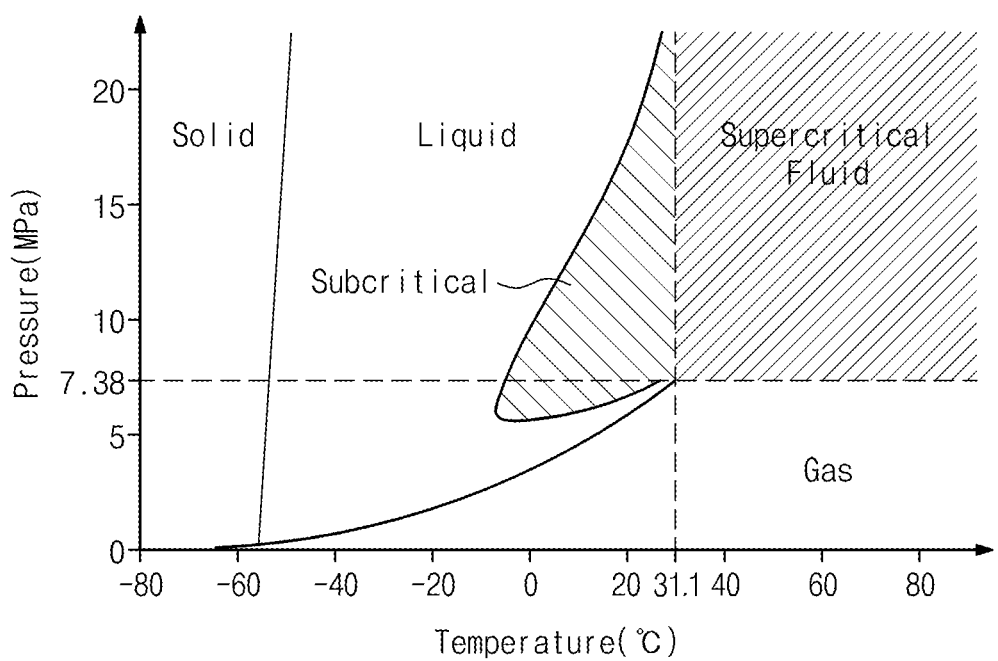
FIG. 3 is a view illustrating a phase transition of carbon dioxide.

FIG. 3 is a view illustrating a phase transition of carbon dioxide. When carbon dioxide has a temperature of about 31.1° C. or more and a pressure of about 7.38 Mpa or more, the carbon dioxide may become in a supercritical state. The carbon dioxide may be nonpoisonous, nonflammable, and inert properties. Also, the supercritical carbon dioxide has a critical temperature and pressure less than those of other fluids. Thus, the supercritical carbon dioxide may be adjusted in temperature and pressure to easily control dissolution thereof. Also, when compared to water or other solvents, the supercritical carbon dioxide may have a diffusion coefficient less by about 10 times to about 100 times than that of the water or other solvents and a very low surface tension. Thus, the supercritical carbon dioxide may have physical properties suitable for performing the drying process. Also, the carbon dioxide may be recycled from byproducts generated by various chemical reactions. In addition, the supercritical carbon dioxide used in the drying process may be circulated and reused to reduce environmental pollution.

Figure 4:
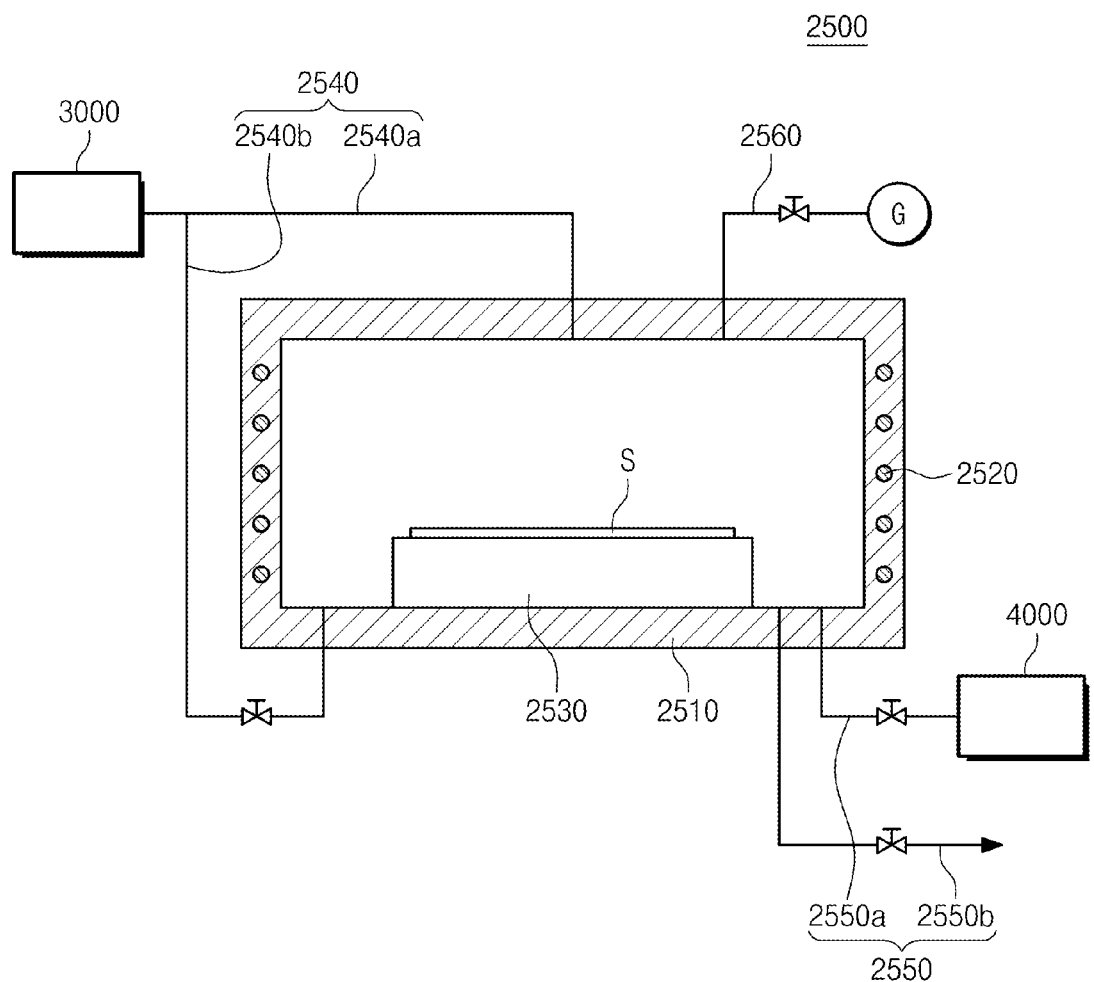
FIG. 4 is a sectional view of a second process chamber of FIG. 1.

FIG. 4 is a sectional view of the second process chamber 2500 of FIG. 1. The second process chamber 2500 includes a housing 2510, a heating member 2520, a support member 2530, a supercritical fluid supply tube 2540, and a vent line 2550. The inside of the housing 2510 may provide a space which is sealed from the outside to dry the substrate S. The housing 2510 may be formed of a material enough to endure a high pressure. The heating member 2520 for heating the inside of the housing 2510 may be disposed between an inner wall and an outer wall of the housing 2510. Of cause, the present invention is not limited to a position of the heating member 2520. For example, the heating member 2520 may be disposed at a position different from the above-described position.

The support member 2530 supports the substrate S. The support member 2530 may be fixed and installed within the housing 2510. Alternatively, the support member 2530 may not be fixed, but be rotated to rotate the substrate S seated on the support member 2530.

The supercritical fluid supply tube 2540 supplies a supercritical fluid into the housing 2510. The supercritical fluid supply tube 2540 includes at least one of an upper supply tube 2540a and a lower supply tube 2540b. The upper supply tube 2540a is connected to an upper portion of the housing 2510 and the supercritical fluid supply unit 3000. The lower supply tube 2540b is connected to a lower portion of the housing 2510 and the supercritical fluid supply unit 3000. Each of the upper supply tube 2540a and the lower supply tube 2540b may include a valve V for adjusting a flow rate of the supercritical fluid. The valve V may be a switching valve or a flow control valve. Thus, the supercritical fluid may be supplied into the housing 2510 through at least one of the upper and lower supply tubes 2540a and 2540b according to the progression of the second drying process. Here, the lower supply tube 2540b may be branched from the upper supply tube 2540b. Thus, the upper and lower supply tubes 2540a and 2540b may be connected to the same supercritical fluid supply unit 3000. Alternatively, the upper and lower supply tubes 2540a and 2540b may be connected to the supercritical fluid supply units 3000 different from each other, respectively.

The supercritical fluid within the housing 2510 may be discharged through the vent line 2550. The supercritical fluid discharged through the vent line 2550 may be discharged to the outside, i.e., the atmosphere or the recycling unit 4000. The vent line 2550 may be provided in one or plurality. For example, the first vent line 2550a may be connected to the recycling unit 4000 to discharge the supercritical fluid into the recycling unit 4000, and the second vent line 2550b may discharge the supercritical fluid into the atmosphere. When quick decompression within the housing 2510 is required, the supercritical fluid may be directly discharged into the atmosphere through the second vent line 2550b instead of the first vent line 2550a.

A valve V may be disposed in the vent line 2550. The vent line 2550 may be disposed under the housing 2510. Alternatively, the vent line 2550 may be disposed above the housing 2510.

The second process chamber 2500 may further include a gas supply tube 2560.

The gas supply tube 2560 supplies an inert gas into the housing 2510. Here, the inert gas may include $N_2$, He, Ne, and Ar. The gas supply tube 2560 is connected to the housing 2510 and a gas supply source G. The gas supply tube 2560 may be connected to an upper portion of the housing 2510. A valve V for regulating a flow rate may be disposed in the gas supply tube 2560.

When the gas supply tube 2560 is provided to the second process chamber 2500, the inert gas may be discharged through the vent line 2550. For example, the inert gas may be discharged into the atmosphere through the second vent line 2550b. Alternatively, the inert gas may be discharged into the atmosphere through a separate third vent line (not shown).

In the second process chamber 2500, the number and arrangement of the supercritical fluid supply tube 2540, the gas supply tube 2560, and the vent line 2550 may be changed in consideration of the process efficiency, the foot print, and the like. For example, the supercritical fluid supply tube 2540 or the vent line 2550 may be disposed on a side surface of the housing 2510.

Thus, the second drying process using the supercritical fluid may be performed in the second process chamber 2500. For example, in the second process chamber 2500, the second drying process using the supercritical fluid may be performed on the substrate S on which the chemical process, the cleaning process, and the first drying process using the organic solvent are successively performed. When the substrate S is seated on the support member 2530 by the transfer robot 2210, the heating member 2520 heats the inside of the housing 2510, and the supercritical fluid is supplied through the supercritical fluid supply tube 2540. Accordingly, a supercritical atmosphere may be formed within the housing 2510. When the supercritical atmosphere is formed, the supercritical fluid may dissolve the organic solvent remaining on the substrate S because the organic solvent is not completely dried after the organic solvent is used in the first drying process which is performed lastly in the first process chamber 2300. When the organic solvent is sufficiently dissolved and the substrate S is dried, the supercritical fluid is discharged through a discharge hole. Then, the substrate S is unloaded from the support member 2530 by the transfer robot 2210 to take out.

Figure 5:
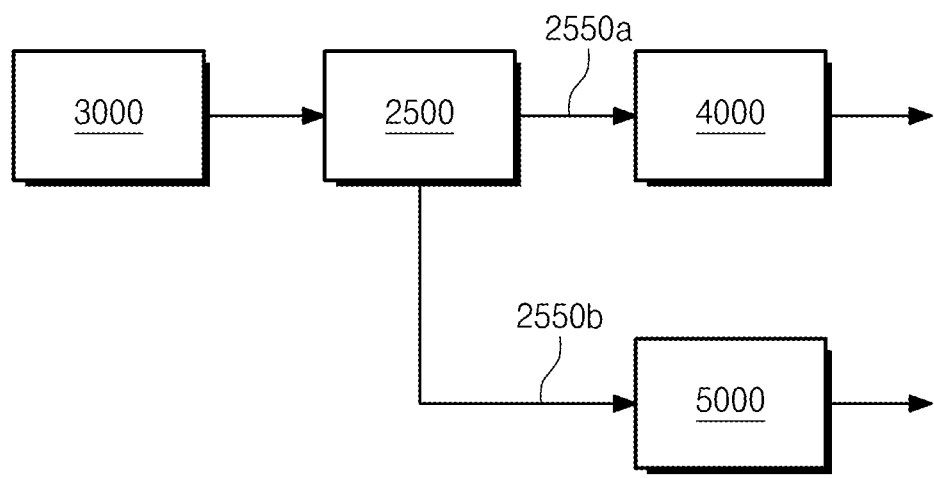
FIG. 5 is a view illustrating a supercritical fluid discharge path in the second process chamber of FIG. 1.

The freezing prevention unit 5000 is disposed in the vent line 2550 to prevent the discharged supercritical fluid from being frozen. FIG. 5 is a view illustrating a supercritical fluid discharge path in the second process chamber 2500 of FIG. 1. As described above, the second process chamber 2500 may discharge the supercritical fluid used in the second drying process into the atmosphere or the recycling unit 3000. Specifically, when the supercritical fluid is quickly discharged into the atmosphere, the discharged supercritical fluid may be suddenly changed in pressure and temperature. As a result, the supercritical fluid itself, the vent line 2550, or the valve V disposed in the vent line 2550 may be frozen. Thus, to prevent the supercritical fluid, the vent line 2550, or the valve V from being frozen, the freezing prevention unit 5000 may be provided in the vent line 2550. Of cause, when the supercritical fluid is discharged into the recycling unit 4000, the freezing phenomenon may occur. Thus, the freezing prevention unit 5000 may be provided in the first vent line 2550a, the second vent line 2550b, or two vent lines 2550a and 2550b. As necessary, only one vent line 2550 may be provided in the second process chamber. Here, the freezing prevention unit 5000 may be disposed in the vent line 2550.

Figure 6:
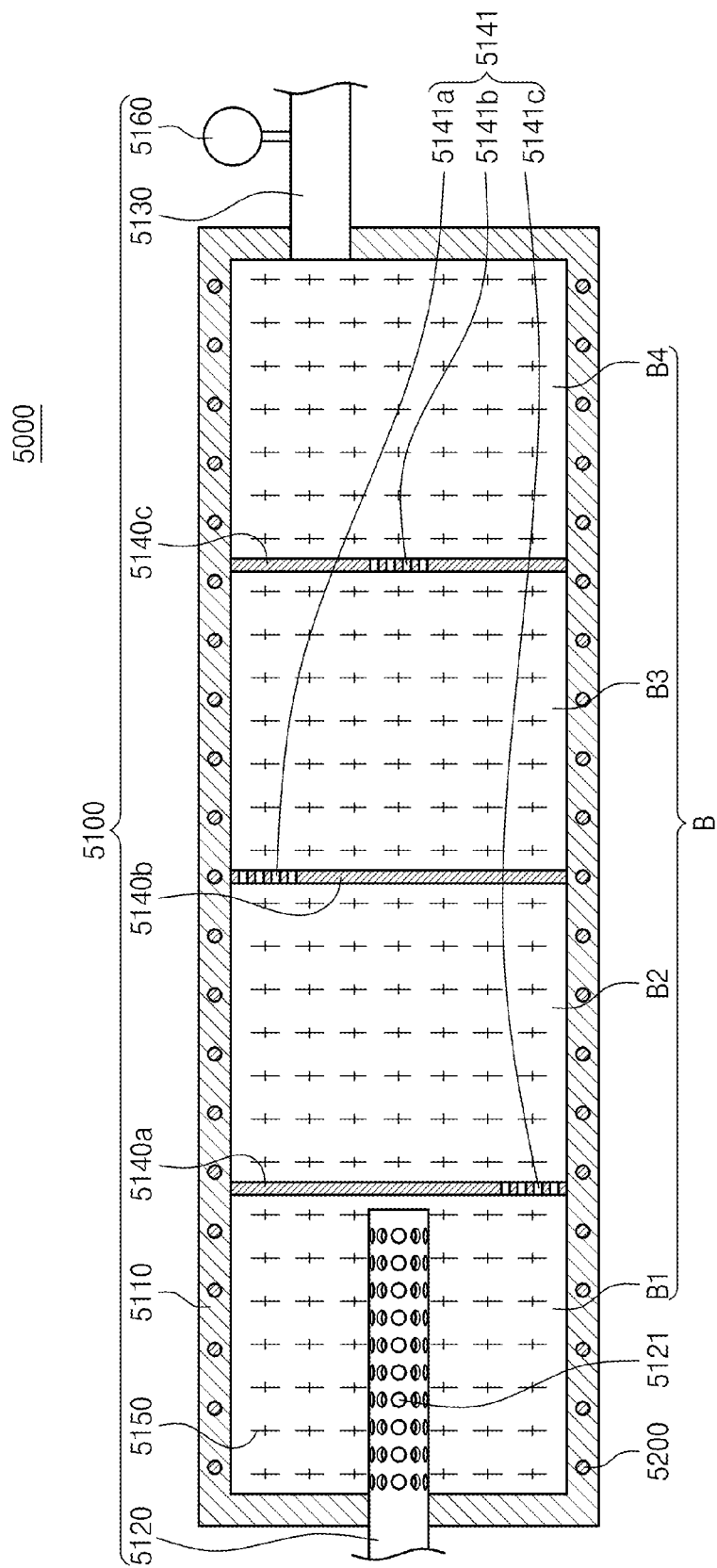
FIG. 6 is a sectional view of a freezing prevention unit of FIG. 5.

FIG. 6 is a sectional view of the freezing prevention unit 5000 of FIG. 5. The freezing prevention unit 5000 may include at least one of a buffer member 5100 and a heater 5200. The buffer member 5100 provides a buffer space B for preventing the supercritical fluid from suddenly dropping in pressure, and the heater 5200 heats the supercritical fluid.

The buffer member 5100 may include a housing 5110, an inflow tube 5120, an exhaust tube 5130, a partition wall 5140, a sound absorption member 5150, and a pressure regulator 5160. The housing 5110 provides the buffer space B. The inflow tube 5120 has one end connected to the vent line 2550 and the other end connected to a side of the housing 5110 to supply the supercritical fluid into the buffer space B. The exhaust tube 5130 has one end connected to the other side of the housing 5110 and the other end opened to the outside or connected to the recycling unit 4000. The supercritical fluid passes through the buffer space B via the inflow tube 5120 and is discharged into the exhaust tube 5130. When the supercritical fluid is directly discharged into the atmosphere, the supercritical fluid may suddenly drop in pressure, and thus, the supercritical fluid may be frozen. On the other hand, when the supercritical fluid passes through the buffer space B, the supercritical fluid may slowly drop in pressure to prevent the supercritical fluid from being frozen.

The partition wall 5140 may be disposed within the housing 5110. The partition wall 5140 may be disposed to have a plane perpendicular to a length direction of the housing 5110. The partition wall 5140 partitions the buffer space B into a plurality of spaces. At least one partition wall 5140 may be disposed in the housing 5110. For example, a first partition wall 5140a, a second partition wall 5140b, and a third partition wall 5140c may be disposed within the housing 5110. Thus, a first buffer space B1, a second buffer space B2, a third buffer space B3, and a fourth buffer space B5 may be successively defined from the inflow tube 5120 toward the exhaust tube 5130.

An vent hole 5141 through which the supercritical fluid passes is defined in the partition wall 5140. The supercritical fluid flows into a next buffer space B or the exhaust tube 5130 through the vent hole 5141. The vent hole 5141 defined in the partition wall 5140 disposed adjacent to the inflow tube 5120 may be defined in a position different from that at which the inflow tube 5120 is disposed when viewed in a length direction of the housing 5110. Also, the vent hole 5141 defined in the partition wall 5140 disposed adjacent to the exhaust tube 5130 may be different in a position different from that at which the exhaust tube 5130 is disposed when viewed in a length direction of the housing 5110. When a plurality of partition walls 5140 are disposed within the housing 5110, the vent holes 5141 adjacent to each other may be defined at positions different from each other when viewed in the length direction of the housing 5110.

Figure 7:
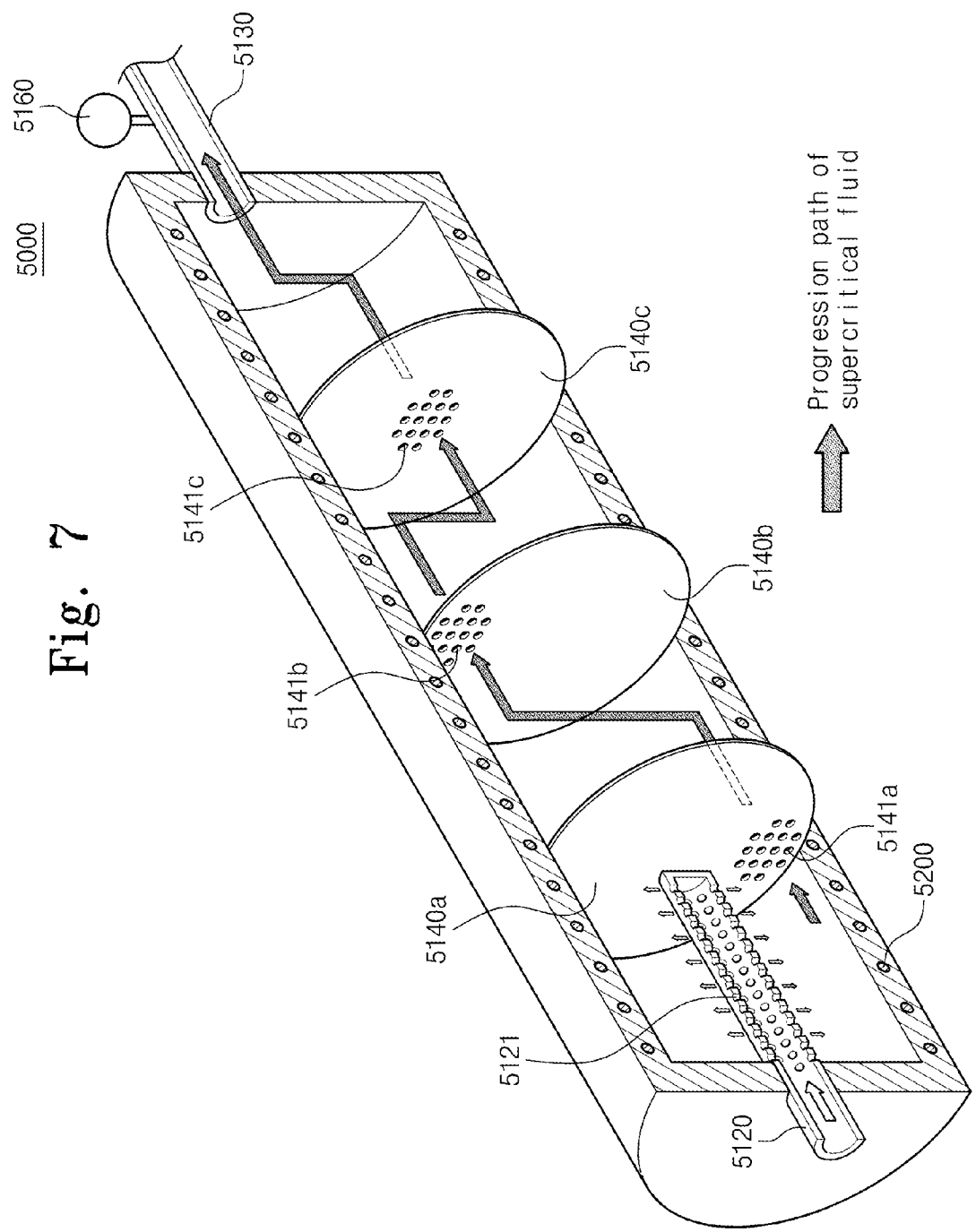
FIG. 7 is a view illustrating a supercritical fluid progression path in a buffer space FIG. 6.
Figure 8:
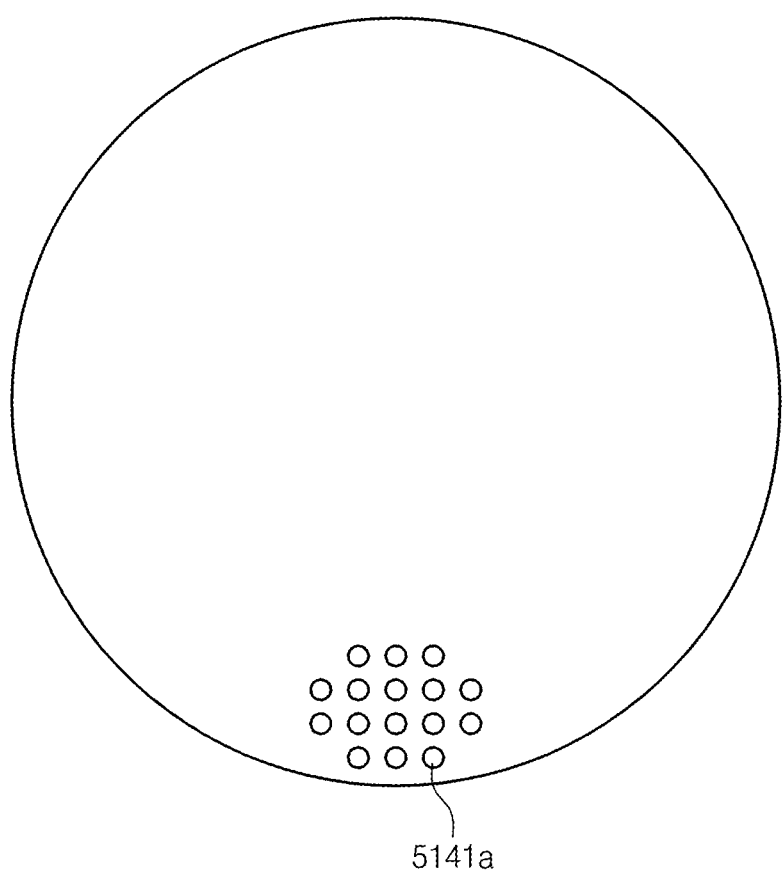
FIGS. 8 to 10 are views of a first partition wall, a second partition wall, and a third partition wall of FIG. 6, respectively.
Figure 9:
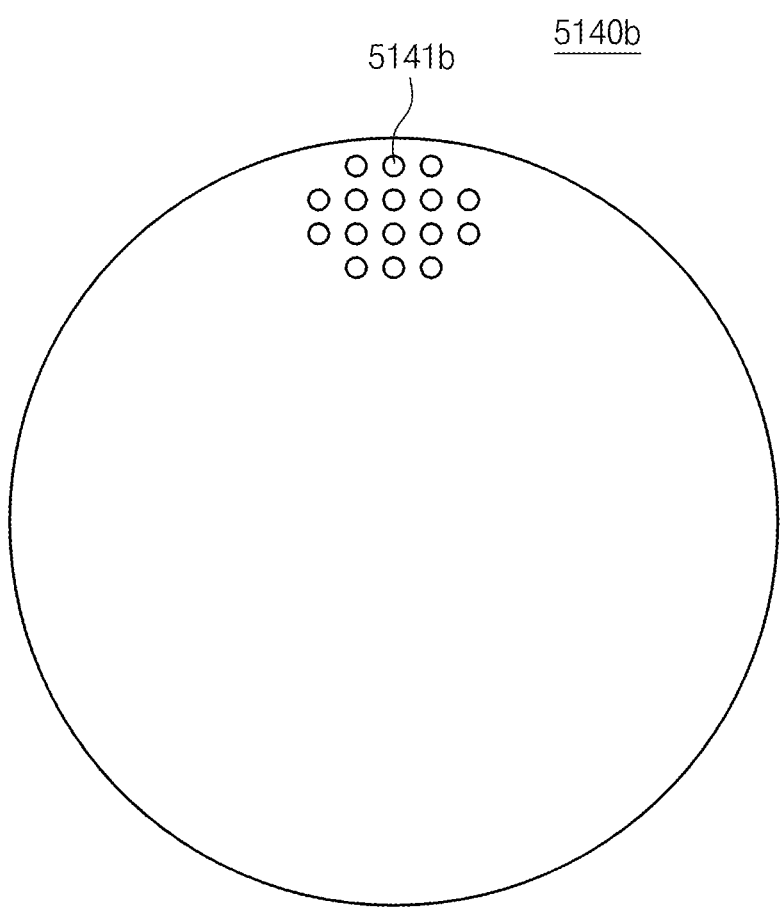
Figure 10:
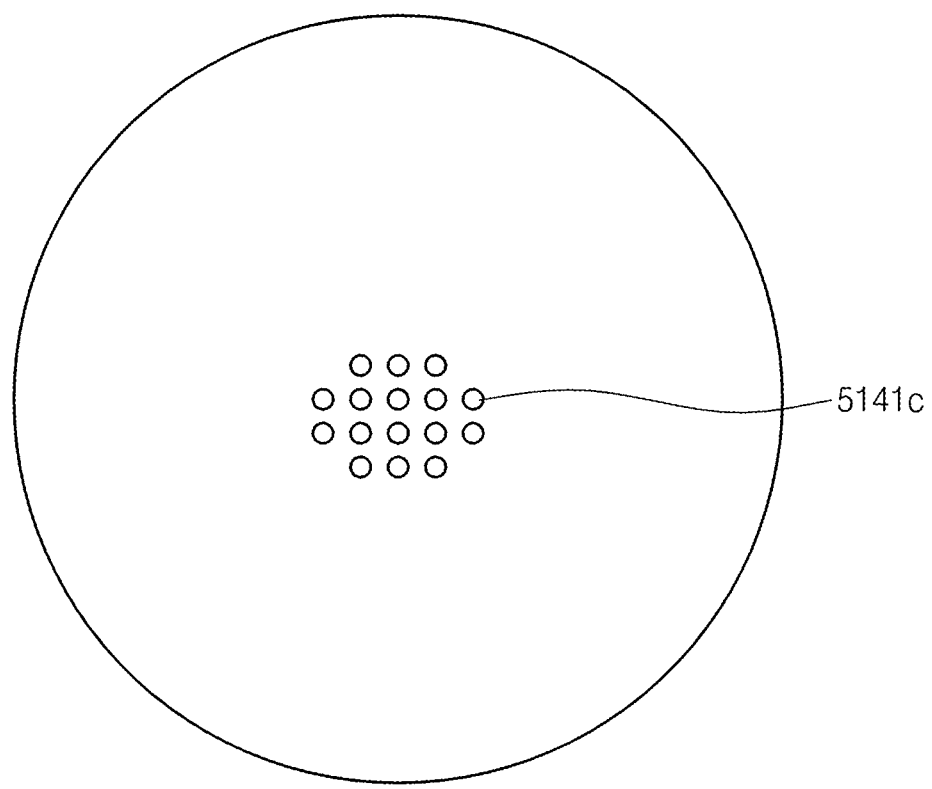

FIG. 7 is a view illustrating a supercritical fluid progression path in the buffer space B of FIG. 6. FIGS. 8 to 10 are views of the first partition wall 5140a, the second partition wall 5140b, and the third partition wall 5140c of FIG. 6, respectively. Here, the sound absorption member 5150 may be omitted in the buffer member 5100 of FIG. 7. Since the sound absorption member 5150 is not an essential component, the sound absorption member 5150 may be selectively provided in the buffer member 5100.

Specifically, in a case where the three partition walls 5140a, 5140b, and 5140c are provided in the housing 5110, when viewed in the length direction of the housing 5110, the inflow tube 5120 is disposed in a central portion of one surface of the housing 5110, the first vent hole 5141a is defined in a lower portion of the first partition wall 5140a, the second vent hole 5141b is defined in an upper portion of the second partition wall 5140b, the third vent hole 5140c is defined in a central portion of the third partition wall 5140c, and the exhaust tube 5130 is disposed in a lower portion of the housing 5110. Thus, the supercritical fluid does not straightly flow in the buffer space B, but flows in a zigzag shape. Accordingly, the supercritical fluid may be reduced in flow rate and interrupted in flow. Also, the supercritical fluid may be gradationally reduced in pressure while passing through the buffer spaces B1, B2, B3, and B4.

The vent hole 5141 may be defined as one opening or a plurality of fine holes. When the vent hole 5141 is defined as the plurality of fine holes, the vent hole may serve as a resistance in the flow of the supercritical fluid to reduce the flow rate of the supercritical fluid.

Figure 11:
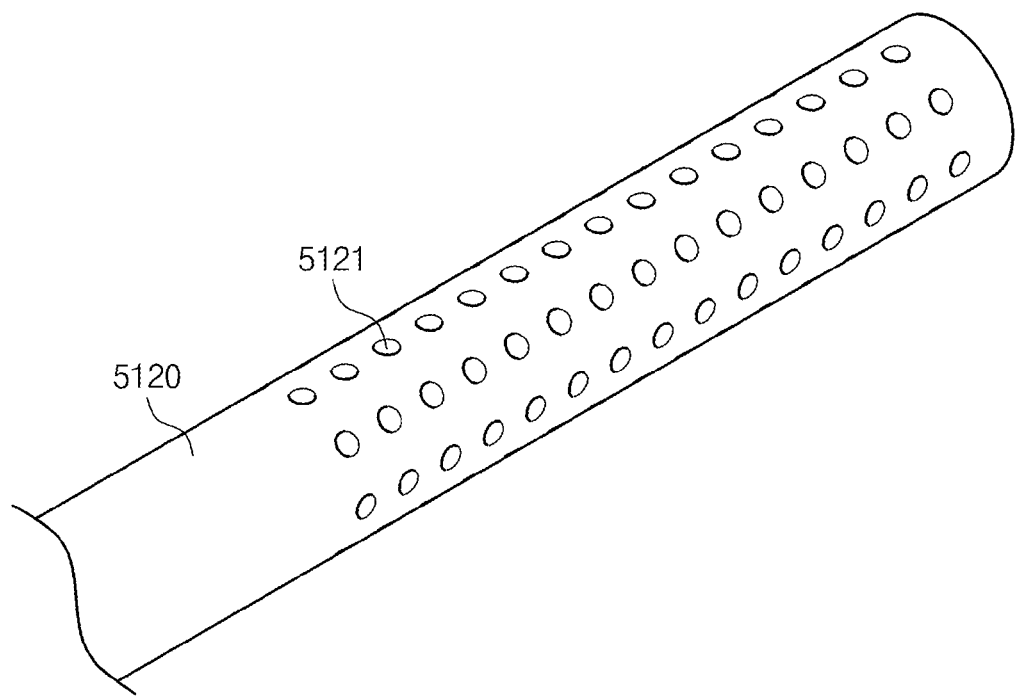
FIG. 11 is a perspective view of an inflow tube of FIG. 6.

The inflow tube 5120 may be partially inserted into the housing 5110. FIG. 11 is a perspective view of the inflow tube 5120 of FIG. 6. An inflow hole 5121 through which the supercritical fluid is discharged into the buffer space B may be defined in a portion of the inflow tube 5120 inserted into the housing 5110. The inflow hole 5121 is defined in a direction perpendicular to the length direction of the housing 5110 to discharge the supercritical fluid in the direction perpendicular to the length direction of the housing 5110. Thus, the supercritical fluid does not straightly flow from the inflow tube 5120 to the exhaust tube 5130. Thus, the supercritical fluid may be reduced in flow rate to prevent the supercritical fluid from suddenly dropping in pressure. The inflow hole 5121 may be defined as a plurality of fine holes, like the vent hole 5141.

Figure 12:
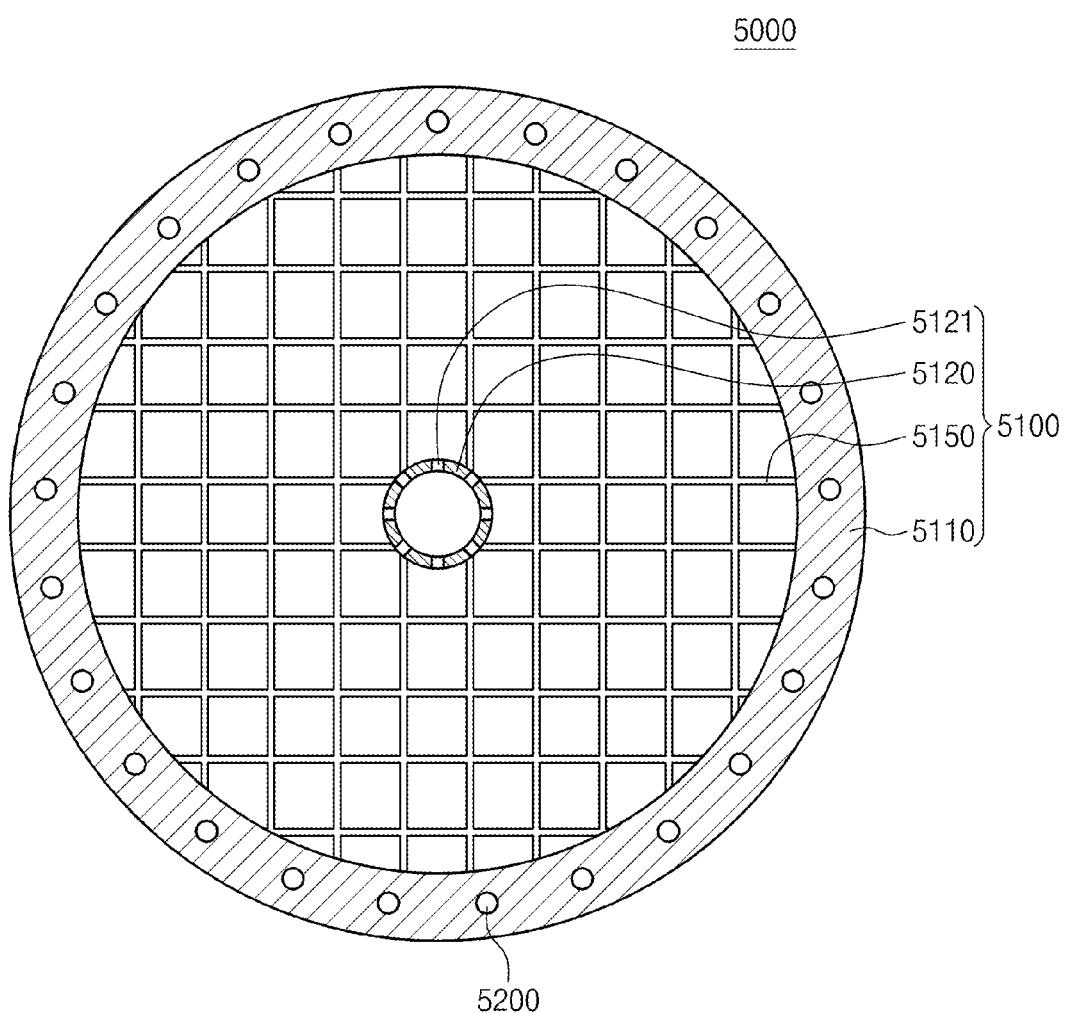
FIG. 12 is a view of a sound absorption member of FIG. 6.

The sound absorption member 5150 is disposed within the housing 5110 to absorb noises generated from the supercritical fluid. FIG. 12 is a view of the sound absorption member 5150 of FIG. 6. When the supercritical fluid drops in pressure, noises may occur. Here, the sound absorption member 5150 may absorb the noises.

The sound absorption member 5150 may be disposed with a wire mesh structure in the buffer space B. The sound absorption member 5150 having the wire mesh structure may interrupt a flow of the supercritical fluid in the buffer space B to slowly drop in pressure of the supercritical fluid. When the supercritical fluid suddenly drops in pressure, large noises may occur. Here, the sound absorption member 5150 may prevent the large noises from occurring to reduce the noises generated from the supercritical fluid. However, the present invention is not limited to the sound absorption member 5150 having the wire mesh structure. For example, the sound absorption member 5150 may have a comby structure, a lattice structure, or a wool structure.

The sound absorption member 5150 may be formed of stainless steel. The supercritical fluid directly contacts the sound absorption member 5150 while passing through the buffer space B. Thus, the sound absorption member 5150 formed of the stainless steel may prevent the supercritical fluid from being contaminated thereby. Specifically, this may have an advantage when the supercritical fluid discharged from the freezing prevention unit 5000 is recycled in the recycling unit 4000.

The pressure regulator 5160 controls an internal pressure of the buffer space B. The pressure regulator 5160 may be a reverse pressure regulator disposed in the exhaust tube 5130.

The heater 5200 may generate heat using an external power source to heat the supercritical fluid. When the supercritical fluid is heated by the heater 5200, it may prevent the freezing phenomenon due to the supercritical fluid from occurring.

The heater 5200 may be disposed at various positions. For example, the heater 5200 may be disposed between outer walls of the housing 5110 to heat the housing 5110. For another example, the heater 5200 may surround an outer wall of the housing 5110.

Figure 13:
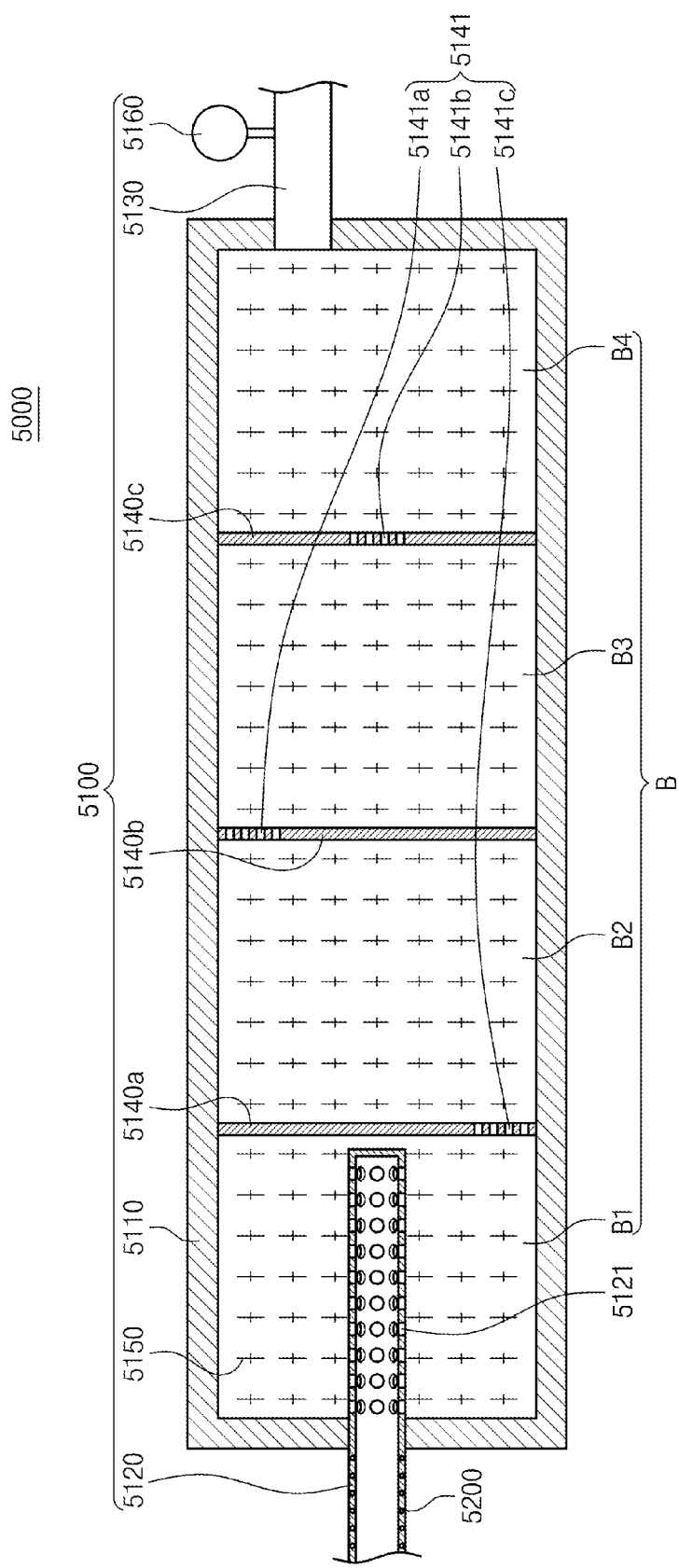
FIGS. 13 and 14 are views illustrating arrangements of heaters of FIG. 6.
Figure 14:
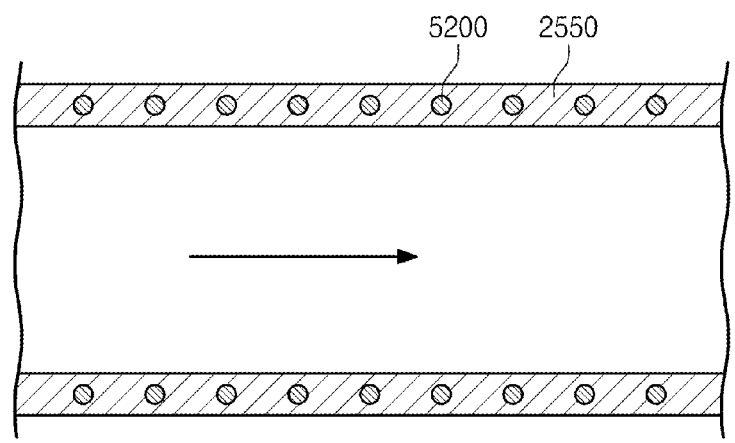

However, it is unnecessary that the heater 5200 is disposed in/on the housing 5110. FIGS. 13 and 14 are views illustrating an arrangement of the heater 520 of FIG. 6. For example, the heater 5200 may be disposed in the inflow tube 5120 or the vent line 2550 connected to the inflow tube 5120. Alternatively, the freezing prevention unit 5000 may include only the heater 5200 except for the buffer member 5100. On the other hand, the freezing prevention unit 5000 may include only the buffer member 5100 except for the heater 5200.

Figure 15:
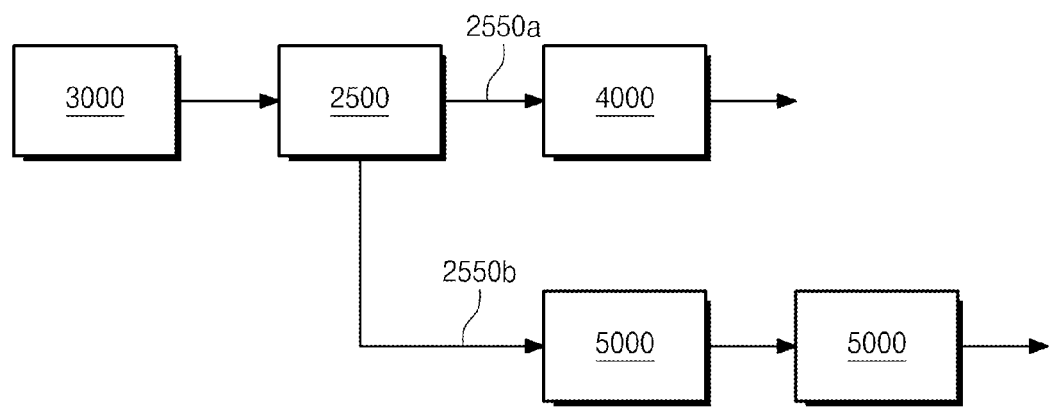
FIGS. 15 and 16 are views illustrating an arrangement of the freezing prevention unit of FIG. 5.
Figure 16:
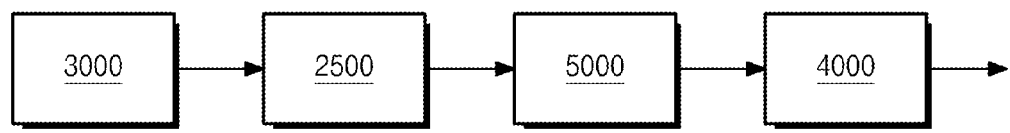

The above-described freezing prevention unit 5000 may be provided in plurality in one vent line 2550 as necessary. The second process chamber may perform the second drying process using the supercritical fluid compressed at about 100 bar to about 150 bar. Here, to increase freezing prevention efficiency of the discharged supercritical fluid, a plurality of freezing prevention units 5000 may be disposed in one vent line 2550 in series. Also, as described above, the freezing prevention unit 5000 may be disposed in the vent line 2550 connected from the second process chamber 2500 to the recycling unit 4000. FIGS. 15 and 16 are views illustrating an arrangement of the freezing prevention unit 5000 of FIG. 5.

The supercritical fluid supply unit 3000 supplies a supercritical fluid into the second process chamber 2500, and the recycling unit 4000 recycles the supercritical fluid used in the second process chamber 2500 to supply the recycled supercritical fluid into the supercritical fluid supply unit 3000. The supercritical fluid supply unit 3000 and the recycling unit 4000 may be realized as independent separate devices or the whole or a portion of the supercritical fluid supply unit 3000 and the recycling unit 4000 may be included in the apparatus 100 for treating a substrate as one component.

Hereinafter, a supercritical fluid of carbon dioxide will be described. However, this is merely an example for convenience of description. The supercritical fluid may have different components.

Figure 17:
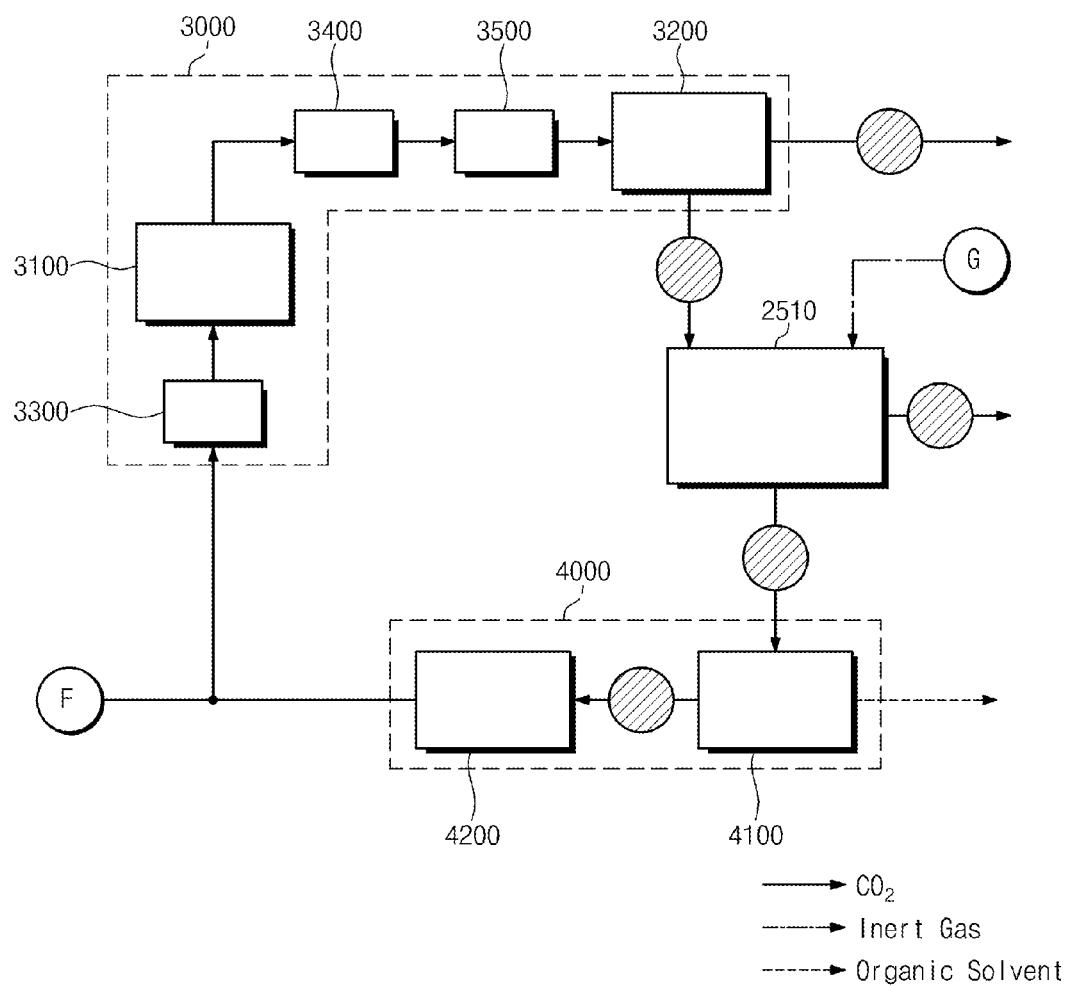
FIG. 17 is a view illustrating a circulation path of the supercritical fluid.

FIG. 17 is a view illustrating a circulation path of the supercritical fluid. Referring to FIG. 17, the supercritical fluid may be recycled while being circulated in the supercritical fluid supply unit 3000, the second process chamber 2500, and the recycling unit 4000. In the circulation process, the freezing prevention unit 5000 may be disposed in a line through which the supercritical fluid is discharged. The freezing prevention unit 5000 may be disposed at a predetermined position of portions corresponding to deviant crease lines of FIG. 17.

The supercritical fluid supply unit 3000 may include a storage tank 3100, a water supply tank 3200, a first condenser 3300, a second condenser 3400, and a pump 3500.

Carbon dioxide is stored in the storage tank 3100 in a liquid state. The carbon dioxide may be supplied from the outside or the recycling unit 400 and then stored in the storage tank 3100. Here, the carbon dioxide supplied from the outside or the recycling unit 4000 may be in a gaseous state. The first condenser 3300 changes the gaseous carbon dioxide into liquid carbon dioxide to store the liquid carbon dioxide in the storage tank 3100. Since the liquid carbon dioxide has a volume less than that of the gaseous carbon dioxide, a large amount of carbon dioxide may be stored in the storage tank 3100.

The water supply tank 3200 receives the carbon dioxide from the storage tank 3100 to produce a supercritical fluid state. Then, the supercritical fluid is supplied into the second process chamber 2500 of the process module 2000. The carbon dioxide stored in the storage tank 3100 is moved into the water supply tank 3200 while being changed into a gaseous state when the valve V connecting the storage tank 3100 to the water supply tank 3200 is opened. Here, the second condenser 3400 and the pump 3500 may be disposed in the line connecting the storage tank 3100 to the water supply tank 3200. The second condenser 3400 changes the carbon dioxide having the gases state into carbon dioxide having a liquid state. The pump 3500 changes the liquid carbon dioxide into gases carbon dioxide compressed over a critical pressure to supply the gases carbon dioxide into the water supply tank 3200. The water supply tank 3200 may heat the supplied carbon dioxide at a temperature over a critical temperature to produce the supercritical fluid.

The water supply tank 3200 discharges the produced supercritical fluid through the vent line 3210. Here, the carbon dioxide discharged from the water supply tank 3200 may be in a state which is the carbon dioxide is compressed at a pressure of about 100 bar to about 150 bar.

The vent line 3210 may be provided to the water supply tank 3200. For example, the water supply tank 3200 may supply the supercritical fluid into the second process chamber 2500 through the vent line 3210. When the liquid or gaseous carbon dioxide is required in the second process chamber 2500 according to the progression of the processes, the water supply tank 3200 may supply the liquid or gaseous carbon dioxide into the second process chamber 2500.

A plurality of vent lines 3210 may be provided to the water supply tank 3200. For example, a first vent line 3210*a* may be connected to the second process chamber 2500, and a second vent line 3210*a* may discharge the supercritical fluid into the atmosphere. When check of the water supply tank 3200 is required or internal pressure adjustment of the water supply tank 3200 is required, the supercritical fluid may be directly discharged into the atmosphere through the second vent line 3210*b*.

Figure 18:
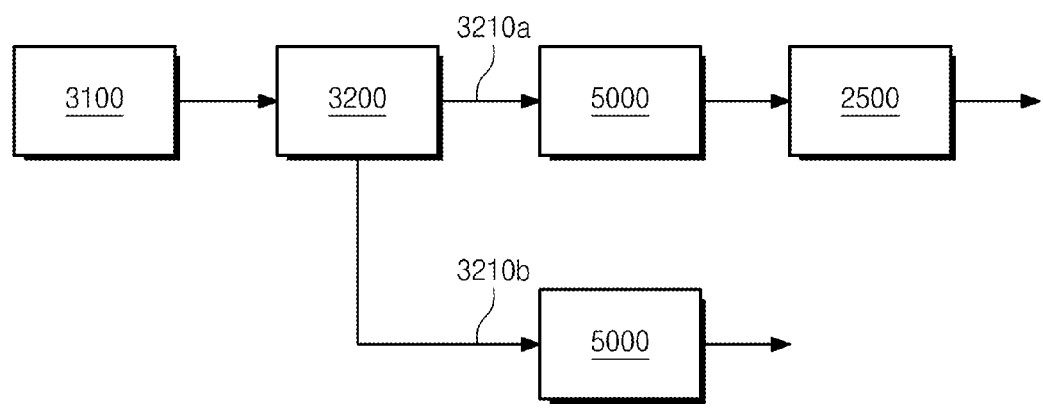
FIG. 18 is a view illustrating a supercritical fluid discharge path in a water supply tank of FIG. 17.

Like the vent line 2550 of the second process chamber 2500, the freezing prevention unit 500 may be provided in the vent line 3210 of the water supply tank 3200. FIG. 18 is a view illustrating a supercritical fluid discharge path in the water supply tank of FIG. 17. Although the freezing prevention unit 5000 is provided in both bent lines 3210*a* and 3210*b* of the water supply tank 3200 including the first vent line 3210*a* connected to the second process chamber 2500 and the second vent line 3210*b* connected to the atmosphere in FIG. 18, the present invention is not limited thereto. For example, the freezing prevention unit 5000 may be provided in only one of the two vent lines 3210*a* and 3210*b*. Here, when only one vent line 3210 is provided to the water supply tank 3200, the freezing prevention unit 5000 may be disposed in the vent line 3210.

Figure 19:
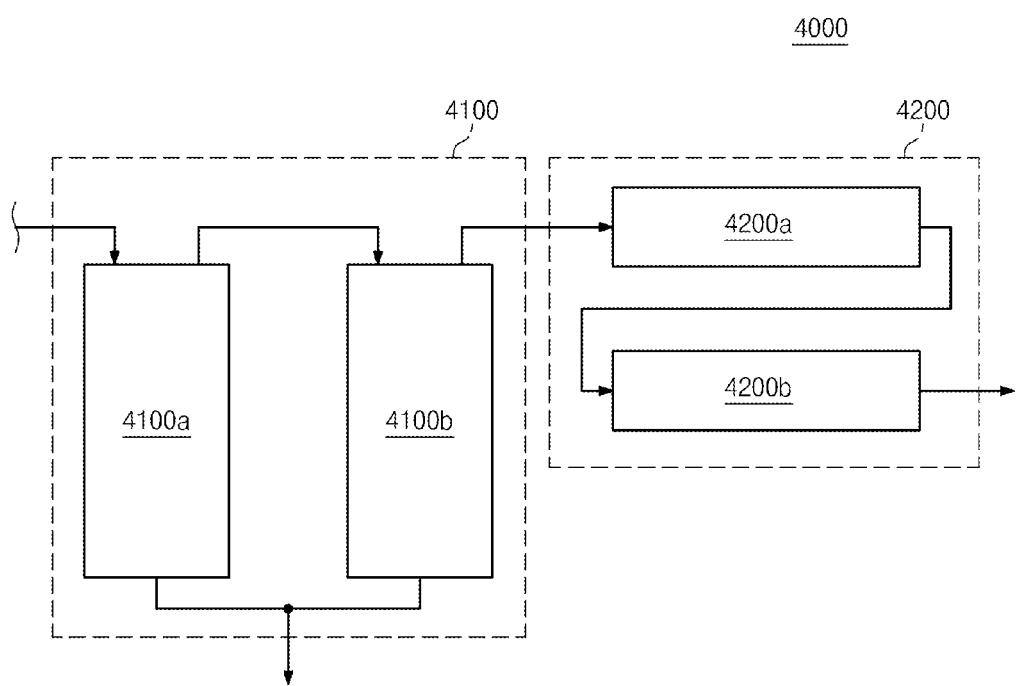
FIG. 19 is a view of a recycling unit of FIG. 17 according to an embodiment of the present invention.
Figure 20:
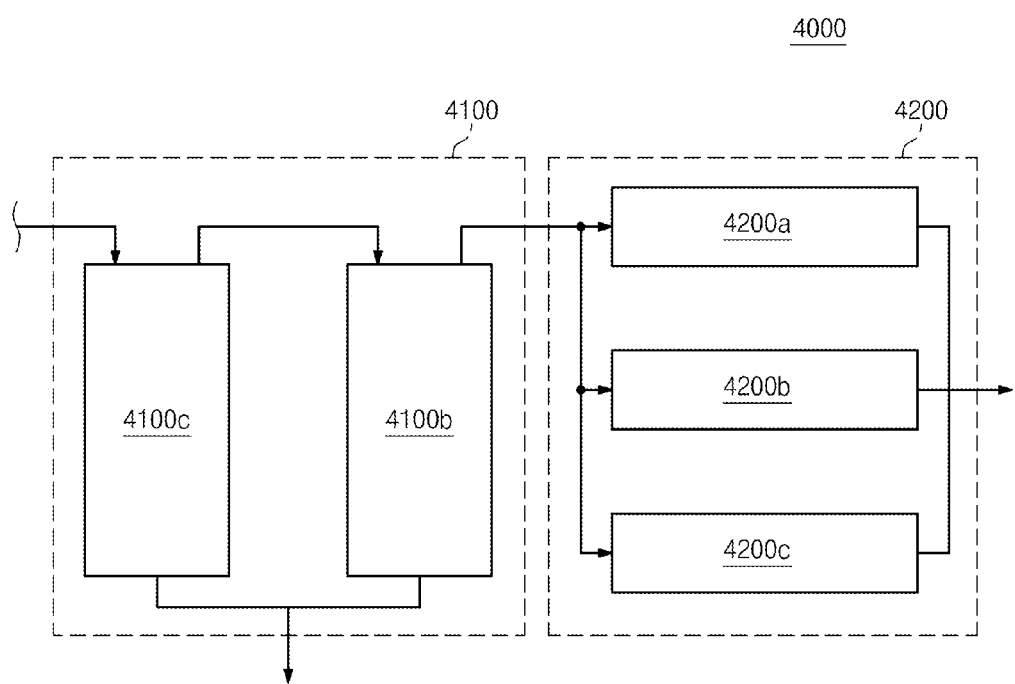
FIG. 20 is a view of a recycling unit 4000 of FIG. 17 according to another embodiment of the present invention.

FIG. 19 is a view of the recycling unit of FIG. 17 according to an embodiment of the present invention, and FIG. 20 is a view of a recycling unit 4000 of FIG. 17 according to another embodiment of the present invention.

The recycling unit 4000 recycles the supercritical fluid containing an organic solvent used for the second drying process in the second process chamber 2500 to supply the recycled supercritical fluid into the supercritical fluid supply unit 3000. The recycling unit 4000 may include at least one of a separation module 4100 and a column module 4200.

The separation module 4100 cools carbon dioxide to liquefy the organic solvent contained in the carbon dioxide, thereby separating the organic solvent from the carbon dioxide. The column module 4200 allows the carbon dioxide to pass through a space in which an absorption material A for absorbing the organic solvent is disposed to separate the organic solvent from the carbon dioxide.

A plurality of separation modules 4100 may be provided in the recycling unit 4000. Here, the separation modules 4100 may be connected to each other in series. For example, the first separation module 4100*a* is connected to the second process chamber 2500 to separate the carbon dioxide and the organic solvent from each other firstly. Here, the freezing prevention unit 500 is disposed in the vent line 2550 of the second process chamber 2500 to allow the supercritical fluid to be introduced into the separation module 4100 through the freezing prevention unit 5000. Then, the second separation module 4100*b* is connected to the first separation module 4100*a* to separate the carbon dioxide and the organic solvent from each other secondly. Thus, the separation of the carbon dioxide and the organic solvent by the separation modules 4100 may be performed several times to obtain more pure carbon dioxide.

Also, a plurality of column modules 4200 may be provided in the recycling unit 4000. Here, the column modules 4200 may be connected to each other in series. Also, the separation of the carbon dioxide and the organic solvent by the column modules 4200 may be performed several times. For example, the first column module 4200*a* is connected to the separation module 4100 to filter the organic solvent from the carbon dioxide firstly. Then, the second column module 4200*b* is connected to the first column module 4200*a* to filter the organic solvent from the carbon dioxide secondly.

Alternatively, the column modules 4200 may be connected parallel to each other. Here, it may take a long time to separate the organic solvent using the column module 4200. Also, it may be difficult to filter a large amount of carbon dioxide using the column module 4200. However, when the plurality of column module are disposed parallel to each other, a large amount of carbon dioxide may be filtered. For example, each of the first, second, and third column modules 4200*a*, 4200*b*, and 4200*c* is connected to the separation module 4100 to filter the organic solvent from the carbon dioxide, thereby providing the carbon dioxide into the supercritical fluid supply unit 3000.

Figure 21:
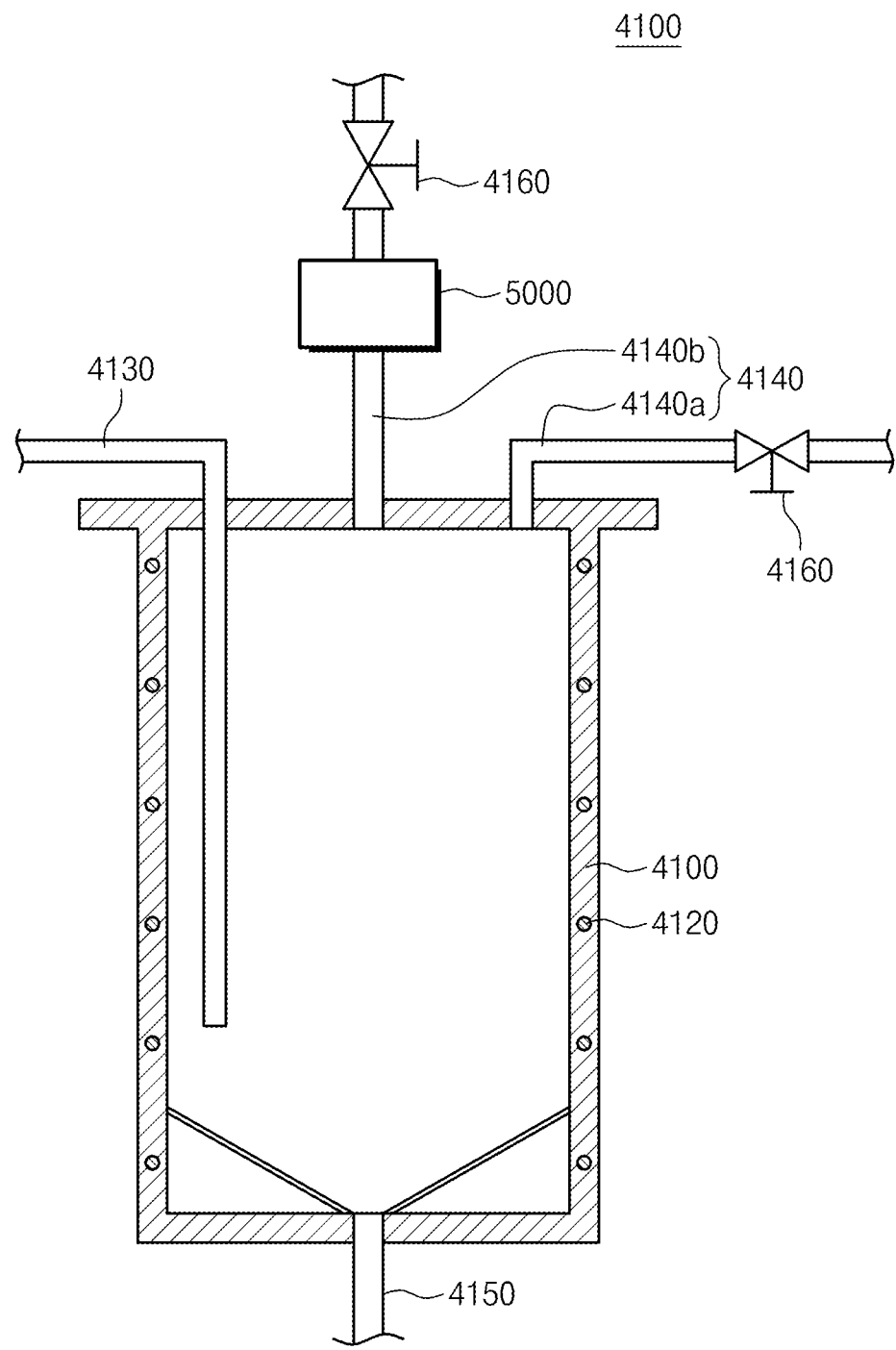
FIG. 21 is a sectional view of a separation module 4100 of FIG. 19.

FIG. 21 is a sectional view of the separation module 4100 of FIG. 19. The separation module 4100 may include a separation tank 4110, a cooling member 4120, an inflow tube 4130, an exhaust tube 4140, a drain tube 4150, and a pressure regulator 4160.

The separation tank 4110 provides a space in which the carbon dioxide and the organic solvent are separated from each other. The cooling member 4120 is disposed between an inner wall and an outer wall of the separation tank 4110 to cool the separation tank 4110. The cooling member 4120 may be realized as a pipe line through which cooling water flows.

The carbon dioxide discharged from the second process chamber 2500 is introduced into the inflow tube 4130. When the separation module 4100 is provided in plurality, the carbon dioxide discharged from the former separation module 4100 may be introduced into the inflow tube 4130. The inflow tube 4130 has one end through which carbon dioxide is supplied into a lower portion of the separation tank 4110. The carbon dioxide supplied into the lower portion of the separation tank 4110 is cooled by the cooling member 4120. Thus, an organic solvent contained in the carbon dioxide is liquefied to separate the organic solvent from the carbon dioxide.

The separated carbon dioxide is discharged through the exhaust tube 4140 connected to an upper portion of the separation tank 4110, and the liquid organic solvent is discharged through the drain tube 4150 connected to a lower portion of the separation tank 4110. A valve V may be disposed in each of the inflow tube 4130, the exhaust tube 4140, and the drain tube 4150 to control the inflow and discharge.

At least one exhaust tube 4140 may be provided to the separation module 4100. For example, the first exhaust tube 4140*a* may be connected to other separation modules 4100 arranged in series, the column module 4200, or the storage tank 3100, and the second exhaust tube 4140*b* may directly discharge the carbon dioxide to the atmosphere. Here, the carbon dioxide discharged from the exhaust tube 4140 may be discharged in a gaseous or supercritical state. In this case, the freezing prevention unit 5000 may be selectively disposed in each of the exhaust tubes 4140 of the separation module 4100. Although the freezing prevention unit 5000 is disposed in the second exhaust tube 4140*b* in FIG. 21, the present invention is not limited thereto. For example, the freezing prevention unit 5000 may be disposed in the first exhaust tube 4140*a* or both first and second exhaust tubes 4140*a* and 4140*b*.

The pressure regulator 4160 regulates an internal pressure of the separation tank 4110. For example, the pressure regulator 4160 may be a reverse pressure regulator disposed in the exhaust tube 4140.

Figure 22:
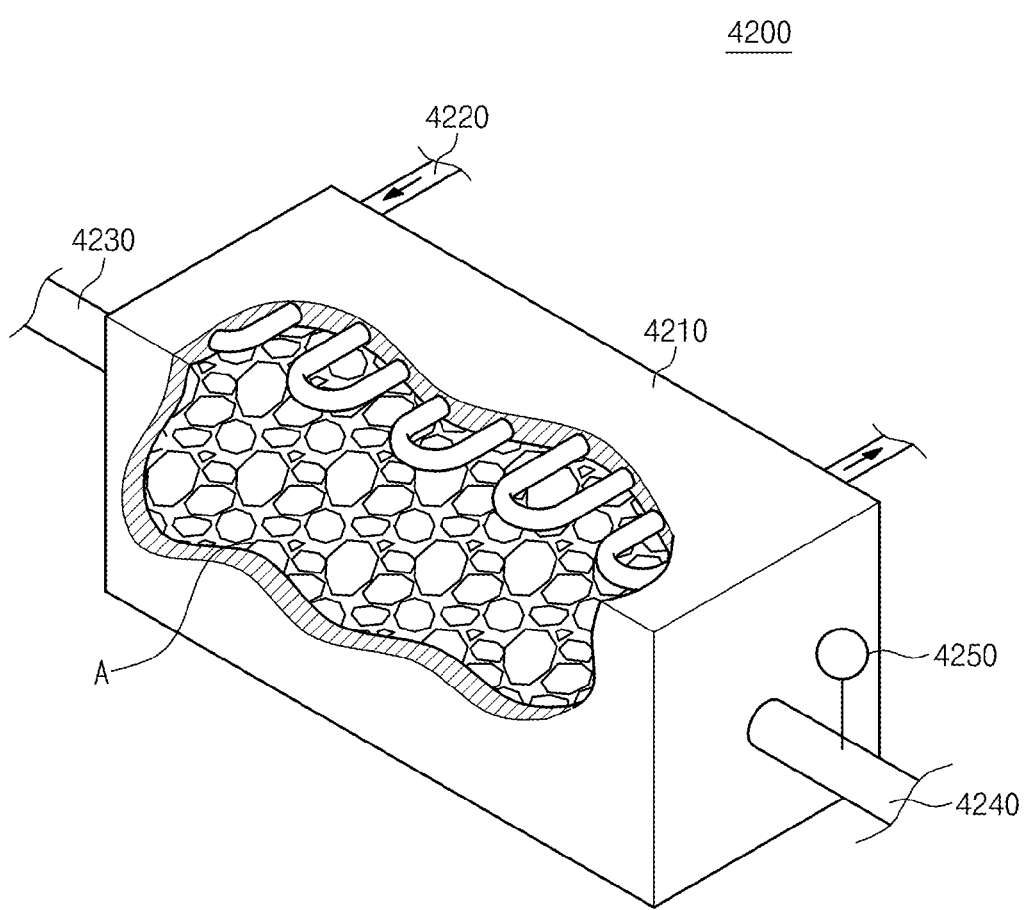
FIG. 22 is a view of a column module 4200 of FIG. 19.

FIG. 22 is a view of the column module 4200 of FIG. 19. The column module 4200 may include an absorption column 4210, a temperature maintenance member 4220, an inflow tube 4230, an exhaust tube 4240, and a concentration sensor 4250.

The absorption column 4210 provides a space in which an organic solvent is separated from carbon dioxide.

An absorption material A is disposed within the absorption column 4210. Here, the absorption material A may be a material for absorbing the organic solvent. For example, the absorption material A may be zeolite. The carbon dioxide is introduced into the absorption column through the inflow tube 4230. The inflow tube 4230 may be connected to the separation module 4100. When the column module 4200 is provided in plurality in series, the inflow tube 4230 may be connected to the former column module 4200. The carbon dioxide passes through the absorption column 4210 and is discharged into the exhaust tube 4240.

The absorption material A is provided to carbon dioxide while the carbon dioxide passes through the absorption column 4210 to absorb an organic solvent from the carbon dioxide. Accordingly, the organic solvent contained in the carbon dioxide is removed to recycle the carbon dioxide. When the carbon dioxide and the organic solvent are separated from each other, heat may occur. Thus, the temperature maintenance member 4220 may maintain the inside of the absorption column 4210 at a predetermined temperature so that the organic solvent is easily separated from the carbon dioxide.

The concentration sensor 4250 may detect a concentration of the organic solvent contained in the carbon dioxide discharged from the absorption column 4210. The concentration sensor 4250 is disposed in the exhaust tube 4240. When a plurality of absorption columns 4210 are provided in series, the concentration sensor 4250 may be disposed in only the last absorption column 4210. Of cause, the concentration sensor 4250 may be disposed in each of the absorption columns 4210. Since an amount of organic solvent capable of being absorbed by the absorption material A is limited, when the organic solvent contained in the carbon dioxide discharged through the concentration sensor 4250 has a concentration greater than a preset concentration, the absorption material A may be replaced. The carbon dioxide discharged from the column module 4200 is supplied into the supercritical fluid supply unit 3000.

Although the column module 4200 is connected to the separation module 4100 in the recycling unit 4000 in the current embodiment, the present invention is not limited thereto. For example, when the separation module 4100 is omitted in the recycling unit 4000, the column module 4200 may be directly connected to the second process chamber 2500.

Hereinafter, a substrate treatment method, a supercritical fluid recycling method, and a supercritical fluid discharge method according to the present invention will be described with reference to the apparatus 100 for treating a substrate according to the present invention.

This is merely an example for convenience of descriptions, and thus, the substrate treatment method, the supercritical fluid recycling method, and the supercritical fluid discharge method according to the present invention may be performed using other substrate treatment apparatuses capable of performing a function equal or similar to that of the substrate treatment apparatus 100, except for the apparatus 100 for treating a substrate according to the present invention.

Figure 23:
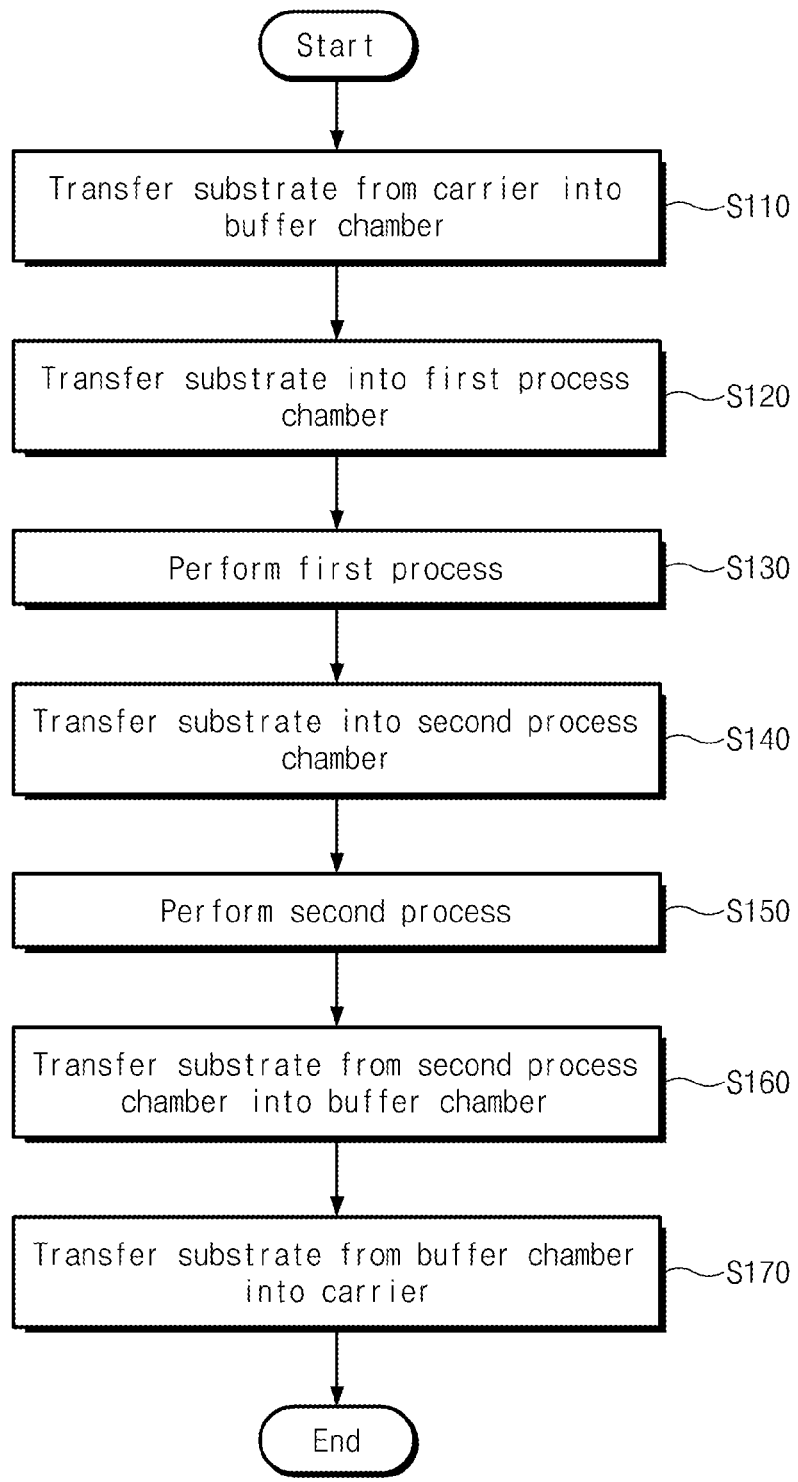
FIG. 23 is a flowchart illustrating a process for treating a substrate according to an embodiment of the present invention.

FIG. 23 is a flowchart illustrating a substrate treatment method according to an embodiment of the present invention. The substrate treatment method according to the embodiment of the present invention may be a cleaning process using a supercritical fluid.

The substrate treatment method according to the embodiment of the prevent invention includes transferring a substrate S from a carrier C seated on a load port 1100 into a buffer chamber 2100 (S110), transferring the substrate S from the buffer chamber 2100 into a first process chamber 2300 (S120), performing a first process (S130), transferring the first process chamber 2300 into a second process chamber 2500 (S140), performing a second process (S150), transferring the substrate S from the second process chamber 2500 into the buffer chamber 2100 (S160), and transferring the substrate S from the buffer chamber 2100 into the carrier C (170). Hereinafter, each of the processes will be described.

In operation S110, an index robot 1210 transfers the substrate S from the carrier C into the buffer chamber 2100.

The carrier C receiving the substrate S transferred from the outside is placed on the load port 1100. A carrier opener (not shown) or the index robot 1210 opens a door of the carrier C so that the index robot 1210 takes the substrate S out of the carrier C. Then, the index robot 1210 transfers the substrate taken out of the carrier C into the buffer chamber 2100.

In operation S120, the transfer robot 2210 transfers the substrate S from the buffer chamber 2100 into the first process chamber 2300.

When the substrate S is placed on a buffer slot of the buffer chamber 2100 by the index robot 1210, a transfer robot 2210 takes the substrate S out of the buffer slot. The transfer robot 2210 transfers the substrate S into the first process chamber 2300.

Figure 24:
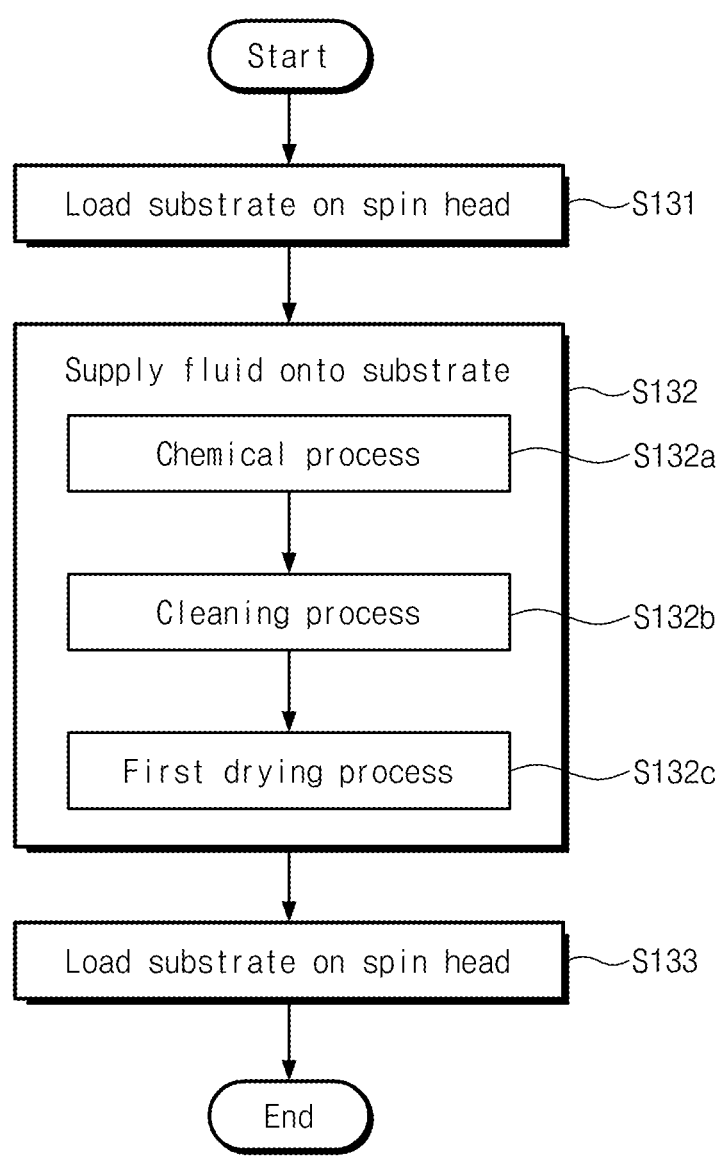
FIG. 24 is a flowchart illustrating a first process according to an embodiment of the present invention.

In operation S130, the first process chamber performs the first process. FIG. 24 is a flowchart illustrating the first process according to the embodiment of the present invention.

In operation S131, the substrate S is placed on a support pin 2412 by the transfer robot 2210 and loaded on a spin head 2410. When the substrate S is placed on the support pin 2412, a chucking pin 2413 is moved from a pick-up position to a fixing position to fix the substrate S. When the substrate S is seated, a fluid supply member 2420 supplies a fluid onto the substrate S in operation S132. Here, the spin head 2410 is rotated to rotate the substrate S while the fluid is supplied onto the substrate S. Thus, the fluid may be uniformly supplied onto an entire surface of the substrate S. Also, a recovery container 2430 may be vertically moved to recover the fluid bouncing from the substrate S by the rotation of the substrate S after the fluid is supplied onto the substrate S.

Specifically, when the substrate S is seated, a first fluid supply member 2420a is moved from a standby position to a process position to spray a first detergent onto the substrate S in operation S132a (a first chemical process). Thus, particles, organic contaminants, metal impurities, and the like remaining on the substrate S may be removed. Here, a first inflow hole 2431a of the first recovery container 2430a may be moved to the same horizontal plane as the substrate S to recover the first detergent.

Next, in operation S132b (a first cleaning process), the first fluid supply member 2420a is moved to the standby position, and a second fluid supply member 2420b is moved from the standby position to the process position to spray a rinsing agent. Thus, residues of the first detergent remaining on the substrate S may be cleaned. Here, a second inflow hole 2431b of a second recovery container 2430b may be moved to the same horizontal plane as the substrate S to recover the rinsing agent.

Next, in operation S132c (a first drying process), the second fluid supply member 2420b returns to the standby position, and a third fluid supply member 2420c is moved from the standby position to the process position to spray an organic solvent. Thus, the rinsing agent remaining on the substrate S may be substituted for the organic solvent. Here, a third inflow hole 2431c of the third recovery container 2430c may be moved to the same horizontal plane as the substrate S to recover the organic solvent. Also, the organic solvent may be supplied in a state where the organic solvent in heated at a temperature greater than room temperature to easily dry the organic solvent or in a heated vapor state. Also, in the operation S132c, the spin head 2410 may rotate the substrate S so that the organic solvent is easily dried after the spray of the organic solvent is finished.

A process (a second chemical process) in which a fourth fluid supply member 2420d sprays a second detergent and a process (a second cleaning process) in which the second fluid supply member 2420b sprays the rinsing agent again may be additionally performed between the operation S132b and the operation S132c. Here, the first and second detergents may be provided as components different from each other to effectively remove foreign substances different from each other, respectively.

Also, the operation S132c may be omitted as necessary.

When the spray of the fluid onto the substrate S is finished, the rotation of the spin head 2410 may be finished, and the chucking pin 2413 may be moved from the fixed position to the pick-up position. In operation S133, the substrate S may be picked up by the transfer robot 2210 and unloaded from the spin head 2410.

In operation S140, the transfer robot 2210 transfers the substrate S from the first process chamber 230 into the second process chamber 2500.

The transfer robot 2210 picks up the substrate S seated on the spin head 2140 to take the substrate out of the first process chamber 2300. The transfer robot 2210 transfers the substrate S into the second process chamber 2500. The substrate S transferred into the second process chamber 2500 is seated on the support member 2530.

Figure 25:
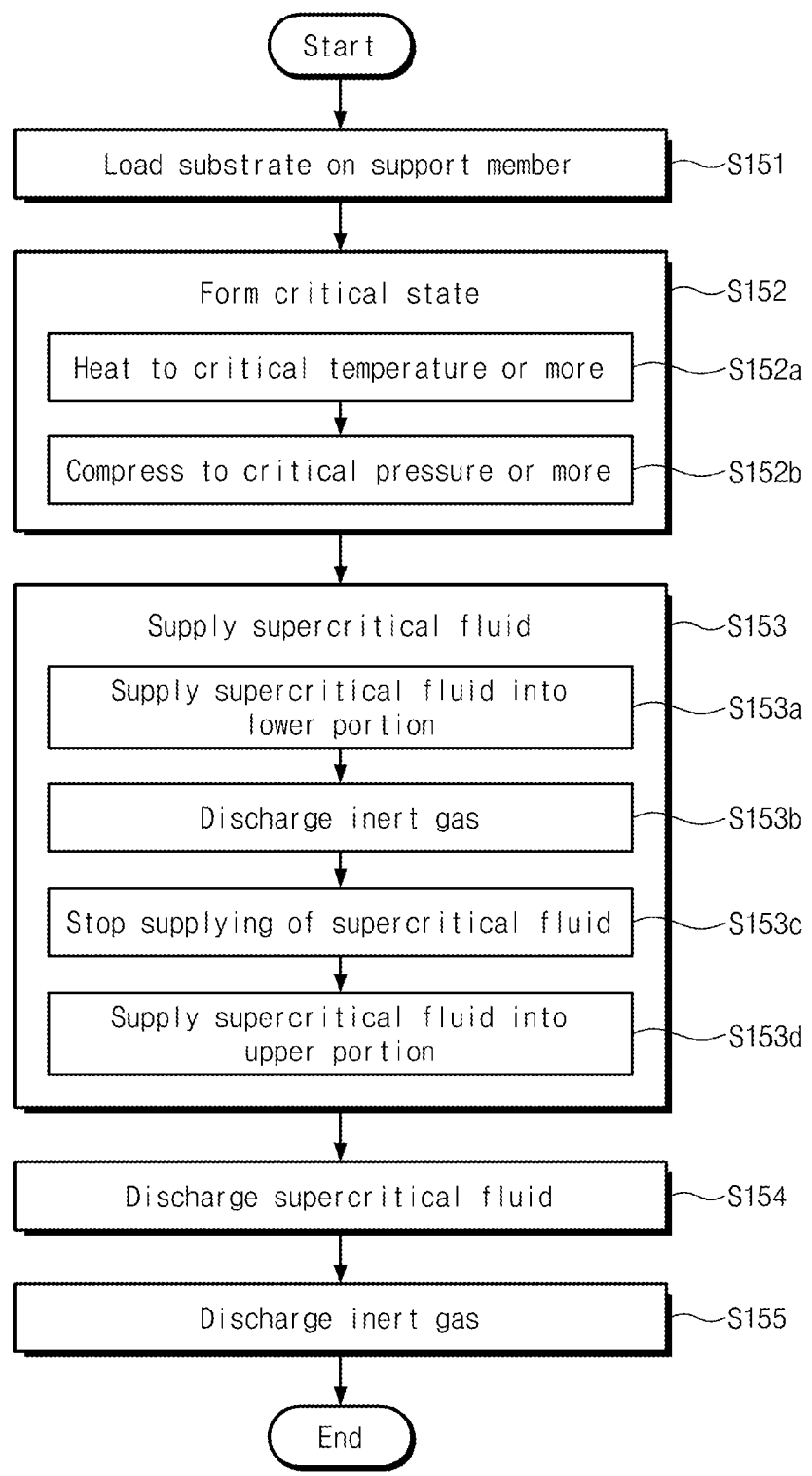
FIG. 25 is a flowchart illustrating a second process according to an embodiment of the present invention.

In operation S150, the second process chamber 2500 performs the second process. FIG. 25 is a flowchart illustrating the second process according to an embodiment of the present invention.

In operation S151, the substrate S is loaded on the support member 2530 of the second process chamber 2500. In operation S152, a critical state is formed within a housing 2510 after and before the substrate S is loaded. Here, the critical state may represent a state in which a temperature and pressure exceed a critical temperature and critical pressure, respectively.

In operation S152a, a heating member 2520 heats the inside of the housing 2510 to form the critical state. Thus, the inside of the housing 2510 may be increased to a temperature greater than the critical temperature. Next, in operation S152b, an inert gas is introduced into the housing 2510 through a gas supply tube 2560. Thus, the inside of the housing 2510 may be filled with the inert gas, and be increased to a pressure greater than the critical pressure.

When the critical state is formed, a supercritical fluid is supplied into the housing 2510 through a supercritical fluid supply tube 2540 in operation S153. For example, the operation S153 may be performed as follows.

First, in operation S153a, the supercritical fluid may be supplied from a lower portion of the housing 2510 through a lower supply tube 2540b. Here, in operation S153b, the inert gas may be discharged to the outside through a vent line 2550.

Since the supercritical fluid is continuously supplied and the inert gas is charged, the inside of the housing 2510 may be filled with only the supercritical fluid to form supercritical atmosphere.

When the supercritical atmosphere is formed, the supply of the supercritical fluid through the lower supply tube 2540b is stopped in operation S153c to supply the supercritical fluid through an upper supply tube 2540a in operation S153d. Thus, the drying of the substrate S using the supercritical fluid may be quickly performed. In this process, since the inside of the housing 2510 is in the critical state, the substrate S may be less damaged or not be damaged even though the supercritical fluid is directly sprayed at a high speed onto the substrate S.

When the substrate S is dried, the supercritical fluid is discharged in operation S154. Here, the inert gas may be supplied into the housing 2510 to discharge the supercritical fluid.

Figure 26:
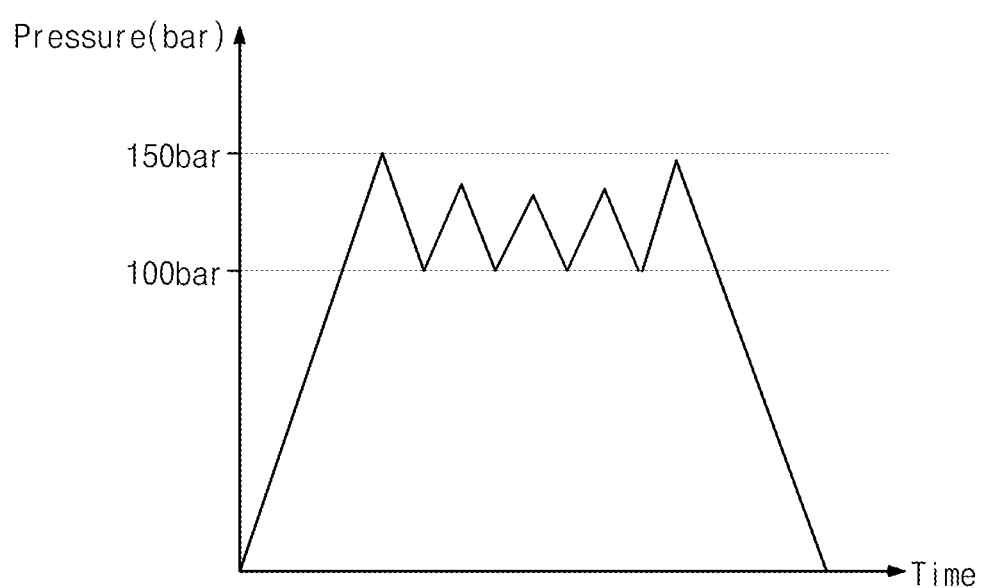
FIG. 26 is a view illustrating supplying and discharging of a supercritical fluid.

On some occasion, since the substrate S is not sufficiently dried in the operation S153, the operation S153 and the S154 may be repeatedly performed as necessary. FIG. 26 is a view illustrating supplying and discharging of the supercritical fluid. For example, the supercritical fluid may be supplied in the operation S153 until the inside of the housing 2510 has a pressure of about 150 bar, and then the supercritical fluid may be discharged until the inside of the housing 2510 has a pressure of about 100 bar.

Also, according to experiments, since it is observed that a removal rate of isopropyl alcohol remaining on circuit patterns of the substrate S is significantly increased in a case where the substrate S is repeatedly dried under the supercritical atmosphere and the inert atmosphere when compared that the substrate S is dried for a long time under the supercritical atmosphere, the two operations S153 and 154 may be repeatedly performed to increase the drying efficiency. Alternatively, the operation S153 may be performed for a long time to dry the substrate S.

When the discharging of the supercritical fluid is finished, the inert gas is discharged to decrease an internal pressure of the housing 2510 in operation S155.

Although the second drying process is performed using the inert gas in the current embodiment, the present invention is not limited thereto. For example, the second drying process may be performed using only the supercritical fluid without the inert gas. Particularly, liquid carbon dioxide may be supplied first, and then, the liquid carbon dioxide may be continuously heated to change the liquid carbon dioxide into gaseous carbon dioxide. Then, the gaseous carbon dioxide may be compressed to form the supercritical atmosphere.

When the substrate S is dried using the supercritical fluid, generation of particles, static electricity, and the pattern collapse which occur in the first drying process using the isopropyl alcohol or in the spin drying process in which the substrate S is rotated may be prevented, and also, generation of water marks on a surface of the substrate S may be prevented to improve performance and yield of the semiconductor device.

In operation S160, the transfer robot 2210 transfers the substrate S from the second process chamber 2500 into the buffer chamber 2100. When the second process is finished, the transfer robot 2210 unloads the substrate S from the support member 2530 to take the substrate S out of the second process chamber 2500, thereby mounting the substrate S on the buffer slot of the buffer chamber 2100.

In the operations S120, S140, and S160, the substrate S may be partially or totally transferred by arms 2213 of transfer robots 2210 different from each other. For example, in each of the operations S120, S140, and S160, the substrate S may be transferred by arms 2213 of the transfer robots 2210 different from each other. Alternatively, the substrate S may be transferred by the same arm 2213 in the operations S120 and 140, and the substrate S may be transferred by a different arm 2213 in the operation S160. This is done for preventing that a hand of the arm 2213 is contaminated because the substrate S has different states in the operations S120, S140, and S160 to secondarily contaminate the substrate S transferred into the next operation by the contaminated arm 2213. Particularly, in the operation S120, the transferred substrate S may be a substrate S before the cleaning process is performed. Also, in operation S140, the substrate S may be a substrate which is not dried. That is, the foreign substances, the detergent, the rinsing agent, or the organic solvent may remain on the substrate S, and thus, the hand of the arm 2213 may be contaminated by the above-described materials. Thus, when the substrate S is picked up by the arm 2213 stained with the above-described materials in the second process, the substrate S may be contaminated again.

In operation S170, the index robot 1210 transfers the substrate C from the buffer chamber 2100 into the carrier C. The index robot 1210 holds the substrate S mounted on the buffer slot to mount the substrate on a slot of the carrier C. Here, the operation S190 may be performed using an arm 1213 different from the arm 1213 used in the operation S110. Thus, as described above, it may prevent the substrate S from being contaminated. When all substrates S are completely received, the carrier C may be transferred to the outside by an overhead hoist transfer (OHT).

Figure 27:
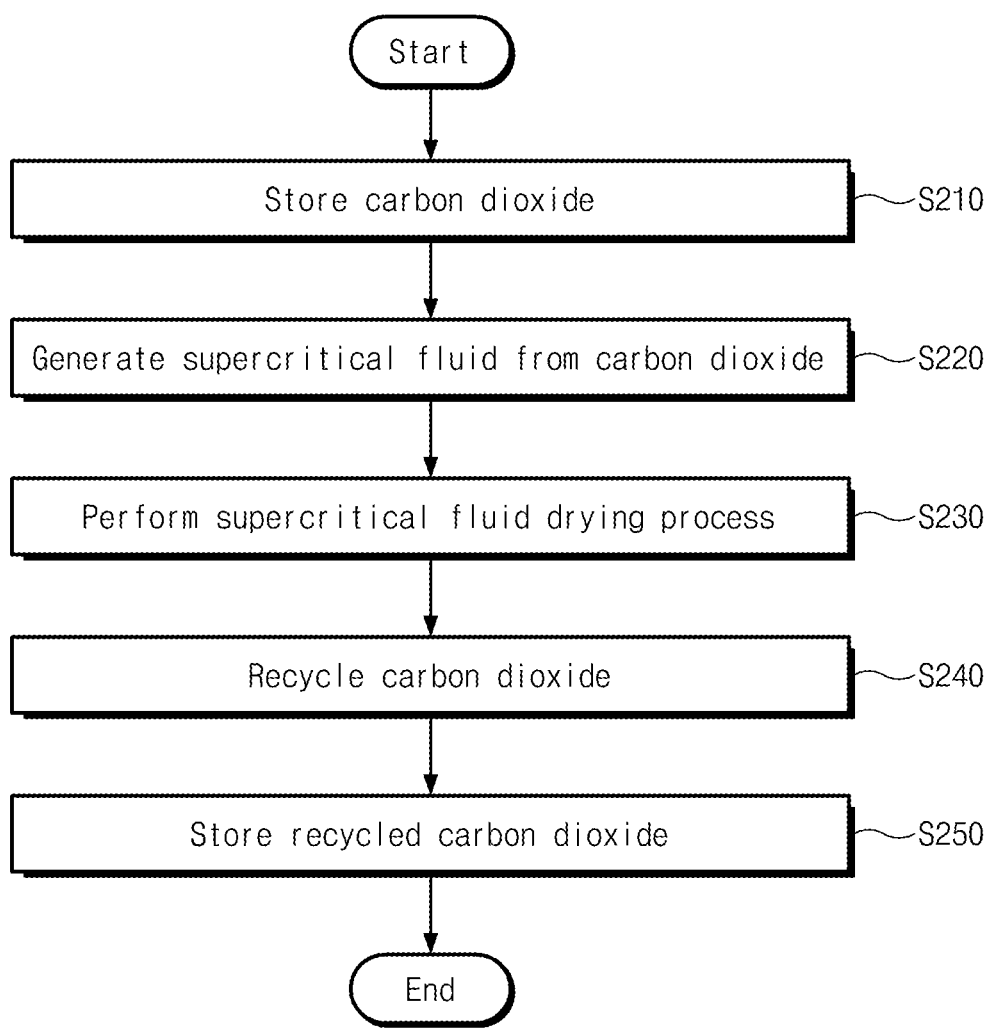
FIG. 27 is a flowchart illustrating a process for recycling a supercritical fluid according to an embodiment of the present invention.

FIG. 27 is a flowchart illustrating a supercritical fluid recycling method according to an embodiment of the present invention. The supercritical fluid recycling method according to the current embodiment includes storing carbon dioxide (S210), changing the carbon dioxide into a supercritical fluid (S220), performing a drying process using the supercritical fluid (S230), recycling the carbon dioxide (S240), and storing the recycled carbon dioxide (S250). Hereinafter, each of the processes will be described.

In operation S210, carbon dioxide is stored in a storage tank 3100. The carbon dioxide is received from an external carbon dioxide supply source F or a recycling unit 4000 and stored in a liquid state. Here, the carbon dioxide may be received in a gaseous state. Thus, a first condenser 3300 may change the gaseous carbon dioxide into the liquid carbon dioxide to supply the liquid carbon dioxide into the storage tank 3100.

In operation S220, a water supply tank 3200 changes the carbon dioxide into a supercritical fluid. The water supply tank 3200 may receive the carbon dioxide from the storage tank 3100 to change the carbon dioxide into the supercritical fluid.

Particularly, the carbon dioxide is discharged from the storage tank 3100 and moved into the water supply tank 3200. Here, the carbon dioxide may be changed into the gaseous carbon dioxide by a change of a pressure. A second condenser 3400 and a pump 3500 are disposed in a line connecting the storage tank 3100 and the water supply tank 3200. The second condenser 3400 changes the gaseous carbon dioxide into the liquid carbon dioxide, and the pump 3500 changes the liquid carbon dioxide into high-pressure gaseous carbon dioxide to supply the high-pressure gaseous carbon dioxide into the water supply tank 3200. The water supply tank 3200 heats the high-pressure gaseous carbon dioxide to produce a supercritical fluid. The water supply tank 3200 provides the supercritical fluid into the second process chamber 2500.

In operation S230, the second process chamber 2500 performs a drying process using the supercritical fluid. The second process chamber 2500 receives the supercritical fluid from the water supply tank 3200 to dry the substrate S using the supercritical fluid. Here, the drying process may be the above-described second drying process. The second process chamber 2500 discharges the supercritical fluid during or after the drying process.

In operation S240, the recycling unit 4000 recycles the carbon dioxide.

In operation S241, a separation module 4100 cools the discharged supercritical fluid to separate an organic solvent from the supercritical fluid. When the supercritical fluid is introduced into the separation tank 4110, a cooling member 4120 cools the supercritical fluid to liquefy the organic solvent dissolved in the supercritical fluid, thereby separating the organic solvent. The organic solvent is discharged through a drain tube 4150 disposed at a lower portion of the separation tank 4110, and the carbon dioxide separated from the organic solvent is separated through an upper exhaust tube 4140 disposed at an upper portion of the separation tank 4110. In the separation through the cooling of the supercritical fluid, an internal temperature of the separation tank 4110 is important.

Figures 28, 29:
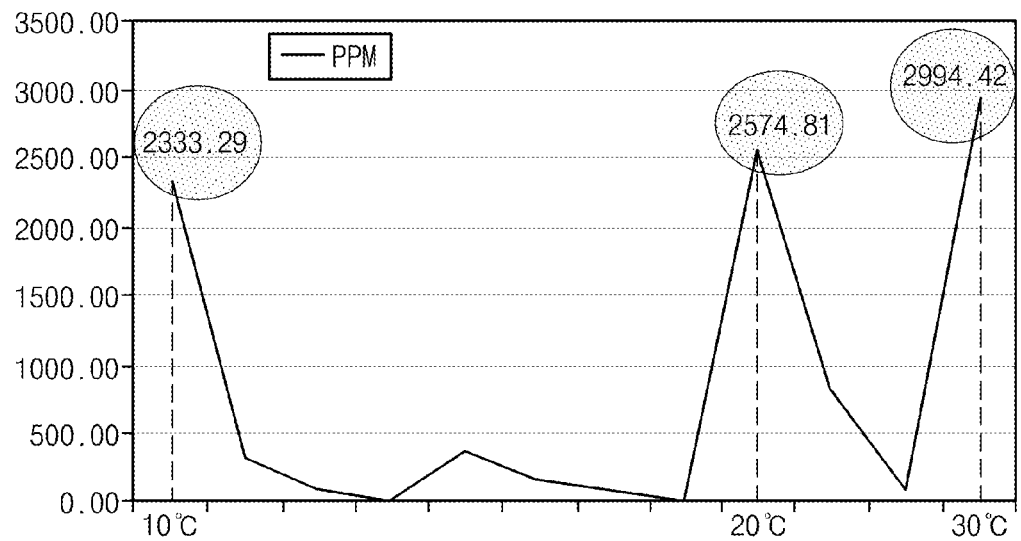
FIG. 28 is a graph illustrating efficiency of the separation unit.
FIG. 29 is a table illustrating the efficiency of the separation unit.

FIG. 28 is a graph illustrating efficiency of the separation unit 4100, and FIG. 29 is a table illustrating the efficiency of the separation unit 4100. FIGS. 28 and 29 illustrate an amount and efficiency of an organic solvent drained when the separation tank 4110 has internal temperatures of about 10° C., about 20° C., and about 30° C. As described above, when the operation S241 is performed at a temperature of about 10° C., it is seen that separation efficiency is improved by about 10% when compared that the operation S241 is performed at a temperature of about 30° C.

In operation S242, a column module 4200 separates the organic solvent again from the carbon dioxide in which the organic solvent is separated primarily by the separation module 4100. The supercritical fluid or the gaseous carbon dioxide is introduced through the inflow tube 4230 to pass through an absorption column 4210, and then is discharged into an exhaust tube 4240. Here, the carbon dioxide passes through an absorption material A. In this process, the organic solvent dissolved in the carbon dioxide is absorbed into the absorption material A. Thus, the organic solvent is separated, and pure carbon dioxide is discharged through the exhaust tube 4240. Therefore, the carbon dioxide may be recycled through the above-described processes.

In operation S250, the recycling unit 4000 provides the recycled carbon dioxide into the storage tank 3100. When the recycling process is finished, the carbon dioxide is moved and stored into the storage tank 3100. Here, the carbon dioxide discharged from the recycling unit 4000 is in gaseous state. Thus, the gaseous carbon dioxide is changed into liquid carbon dioxide by the first condenser 3300 and stored in the storage tank 3100.

FIG. 30 is a flowchart illustrating a supercritical fluid discharge method a according to an embodiment of the present invention. The supercritical fluid discharge method according to the current embodiment includes discharging a supercritical fluid from a container (S310), introducing the supercritical fluid into a buffer member 5100 (S320), decompressing the supercritical fluid (S330), heating the supercritical fluid (S340), absorbing noises generated from the supercritical fluid (S350), and discharging the supercritical fluid from the buffer member 5100. Hereinafter, each of the processes will be described.

In operation S310, the supercritical fluid is discharged from the container through a vent line.

Here, the container may represent a chamber or tank for supplying the supercritical fluid. For example, the container may include the second process chamber 2500, the water supply tank 3200, or a separation tank 4110 of the separation module 4100.

Also, the vent line may represent a comprehensive tube for discharging the supercritical fluid. For example, the vent line may include a vent line 2550 of the second process chamber 2500, a vent line 3210 of the water supply tank 3200, or an exhaust tube 4140 of the separation tank 4110.

In a case where a plurality of vent lines are provided to each container, when the supercritical fluid is discharged through a portion of the plurality of vent lines or the whole vent lines, the supercritical fluid discharge method according to the current embodiment of the present invention may be utilized. For example, when a first vent line 2550*a* for supplying the supercritical fluid into the recycling unit 5000 and a second vent line 2550*b* for discharging the supercritical fluid into the atmosphere are provided to the second process chamber 2500, the supercritical fluid discharge method according to the current embodiment may be applied to a case in which the supercritical fluid is discharged through the first vent line 2550*a*, a case in which the supercritical fluid is discharged through the second vent line 2550*b*, or a case in which the supercritical fluid is discharged through both vent lines 2550*a* and 2550*b*. This is the same in a case of the water supply tank 3200 or the separation module 4110.

As described above, the supercritical fluid may be discharged from the container. For example, the discharging process may be the operation S154 in the substrate treatment apparatus according to an embodiment, the supercritical fluid discharge process performed between the operation S220 and the operation S230 in the supercritical fluid recycling method according to an embodiment, the supercritical fluid discharge process performed between the operation S230 and the operation S240, or the supercritical fluid discharge process performed between the operation S241 and the operation S242. The supercritical fluid discharge process is not limited to the above-described processes. For example, the discharging process may include a case in which the inside of the container is cleaned, a case in which quick discharging of the supercritical fluid stored in the container is required, or a case in which the supercritical fluid is discharged into the atmosphere.

In operation S320, the supercritical fluid is introduced into the buffer member 5100. The supercritical fluid discharged from the container through the vent line is introduced into a housing 5110 through an inflow tube 5120. An inflow hole 5121 may be formed in a direction perpendicular to a length direction of the housing 5110 in the inflow tube 5120. Here, the supercritical fluid is discharged in the direction perpendicular to the length direction of the housing 5110. Thus, it may prevent the supercritical fluid from flowing in the length direction of the housing 5110 to reduce a flow rate and delay pressure drop.

In operation S330, the delay pressure dropping is decompressed while passing through a buffer space B. The buffer space B may be divided into a plurality of spaces by a partition wall 5140. The supercritical fluid is gradationally decompressed while passing through the plurality of spaces. Thus, it may prevent the supercritical fluid from suddenly dropping in pressure to prevent the supercritical fluid from being frozen. Here, as described above, since fine vent holes 5141 are formed in positions different from each other in the partition wall 5140, the supercritical fluid may flow in a zigzag shape, but not flow in a straight line shape. Thus, the flow of the supercritical fluid may be delayed, and thus, the supercritical fluid may slowly drop in pressure.

In operation S340, a heater 5200 heats the supercritical fluid. Thus, it may prevent the supercritical fluid from suddenly dropping in temperature to prevent the supercritical fluid from being frozen. The heater 5200 is disposed in the housing 5110 to heat the housing 5110. Thus, the supercritical fluid passing through the housing 5110 may be heated. Alternatively, the heater 5200 may be disposed in the inflow tube 5120 or the vent line to heat the supercritical fluid passing through the inflow tube 5120 or the vent line.

In operation S350, a sound absorption member 5150 absorbs noises generated from the supercritical fluid. The sound absorption member 5150 is disposed within the housing 5110 to provide a path through which the supercritical fluid passes. Thus, the noises generated while the supercritical fluid drops in pressure may be absorbed into the sound absorption member 5150. The more a pressure drop width of the supercritical fluid is increased, the more the intensity of the noises is increased. Thus, the sound absorption member 5150 has a structure which interrupts a flow of the supercritical fluid to reduce the flow rate of the supercritical fluid, thereby allowing the supercritical fluid to slowly drop in pressure. Thus, the noises generated from the supercritical fluid may be reduced.

In operation S370, the supercritical fluid is discharged from the buffer member through the exhaust tube 5130. The supercritical fluid passes through the buffer space B of the housing 5110 is discharged from the housing 5110 through the exhaust tube 5130. A pressure regulator 5160 may be disposed in the exhaust tube 5130 to constantly maintain a pressure within the buffer space B.

The supercritical fluid discharged through the exhaust tube 5130 may be discharged into the atmosphere or other components of the substrate treatment apparatus 100. For example, the supercritical fluid discharged from the second process chamber 2500 may be supplied into the recycling unit 400, or the supercritical fluid discharged from the water supply tank 3200 may be supplied into the second process chamber 2500.

According to the supercritical fluid discharge method, it may prevent the supercritical fluid from suddenly dropping in pressure when the supercritical fluid is discharged to prevent the supercritical fluid from being frozen. Also, it may prevent the vent line and the valve disposed in the vent line from being frozen by the freezing of the supercritical fluid.

Also, the noises generated due to the sudden pressure drop of the supercritical fluid may be reduced. Also, the generated noises may be absorbed into the sound absorption member to reduce the overall noises.

In the above-described substrate treatment method, supercritical fluid recycling method, supercritical fluid discharge method according to the present invention, the processes performed in each embodiment are not necessary. Thus, each embodiment may selectively include the above-described processes. Furthermore, the embodiments may be realized by being separated from or combined with each other. Also, the processes performed in each embodiment may be realized by separating or combining the processes performed in the other embodiment from or with each other.

Also, it is not necessary to successively perform the processes performed in each embodiment according to the described order. For example, a process described later may be performed first than a process described previously.

According to the present invention, it may prevent the supercritical fluid discharged from the process chamber or the water supply tank from being frozen.

According to the present invention, it may prevent the supercritical fluid from suddenly dropping in pressure by the buffer member.

According to the present invention, the supercritical fluid may be gradationally decompressed while successively passing through the plurality of spaces within the buffer space.

According to the present invention, the supercritical fluid may be interrupted in flow by the partition wall or sound absorption member within the buffer space.

According to the present invention, the discharged supercritical fluid may be heated by a heater to prevent the supercritical fluid from being frozen.

According to the present invention, the noises generated when the supercritical fluid is discharged may be reduced by the sound absorption member.

According to the present invention, since it prevent the supercritical fluid from being frozen when the supercritical fluid is discharged, the semiconductor manufacturing process may be smoothly performed to improve the yield of the substrate.

The feature of the present invention is not limited to the aforesaid, but other features not described herein will be clearly understood by those skilled in the art from this specification and the accompanying drawings.

While specific embodiments of the present invention have been shown and described, it should be understood that other modifications, substitutions and alternatives are apparent to the ordinary skill in the art. Such modifications, substitutions and alternatives can be made without departing from the spirit and scope of the invention and are not limited by the foregoing embodiments and the attached drawings. Also, part or all of the above-described embodiments can be selectively combined and constructed so that various modifications are possible, without the construction and scheme of the above-described embodiments being limitedly applied.

What is claimed is:

1. An apparatus for treating a substrate, the apparatus comprising:
   a container configured to provide a supercritical fluid;
   a vent line configured to discharge the supercritical fluid from the container; and
   a freezing prevention assembly in the vent line, the freezing prevention assembly configured to at least partially restrict flow of the supercritical fluid through the vent line to mitigate a pressure drop in the vent line, the freezing prevention assembly including,
      a housing configured to at least partially define an enclosed space, the housing extending along a longitudinal axis, the housing including a first end and an opposite second end;
      at least one partition wall within the housing, the at least one partition wall extending in a first direction that is perpendicular to the longitudinal axis of the housing, the at least one partition wall is configured to partition the enclosed space into a plurality of spaces, the plurality of spaces including a first space that is proximate to the first end of the housing and a second space that is proximate to the second end of the housing;
      an inflow tube extending through the first end of the housing, the inflow tube configured to direct the supercritical fluid into the first space; and
      a discharge tube extending through the second end of the housing, the discharge tube configured to discharge the supercritical fluid from the second space;
      wherein the at least one partition wall further includes a set of vent holes extending through the at least one partition wall, the set of vent holes defining a restricted fluid pathway between the first and second spaces, such that,
         the at least one partition wall is configured to direct the supercritical fluid between adjacent spaces of the plurality of spaces through the restricted fluid pathway, and
         the freezing prevention assembly is configured to direct the supercritical fluid in a non-linear progression path through the enclosed space between the inflow tube and the discharge tube, such that supercritical fluid flow through the enclosed space is restricted.

2. The apparatus of claim 1, wherein the set of vent holes includes a plurality of vent holes.

3. The apparatus of claim 1, wherein,
   the set of vent holes of the at least one partition wall are offset from the inflow tube and the discharge tube in the first direction.

4. The apparatus of claim 1, wherein,
   the at least one partition wall includes a plurality of partition walls within the housing, the plurality of partition walls are spaced apart along the longitudinal axis of the housing, and the plurality of partition walls each extend in the first direction;
   each partition wall includes a separate set of vent holes; and
   adjacent partition walls along the longitudinal axis of the housing include separate, respective sets of vent holes that are offset from each other in the first direction.

5. The apparatus of claim 4, wherein,
   the plurality of partition walls includes a first partition wall that at least partially defines the first space and a second partition wall that at least partially defines the second space,
   the first partition wall includes a first set of vent holes that are offset from the inflow tube in the first direction; and
   the second partition wall includes a second set of vent holes that are offset from the discharge tube in the first direction.

6. The apparatus of claim 1, wherein the freezing prevention assembly further includes a heater configured to heat the supercritical fluid.

7. The apparatus of claim 6, wherein the heater is in the housing.

8. The apparatus of claim 1, wherein the freezing prevention assembly further includes a sound absorption member within the housing, the sound absorption member configured to absorb a noise generated from the supercritical fluid.

9. The apparatus of claim 8, wherein the sound absorption member includes a wire mesh structure configured to interrupts a flow of the supercritical fluid to prevent the supercritical fluid from suddenly dropping in pressure.

10. The apparatus of claim 1, wherein,
the inflow tube includes one end connected to the vent line and an opposite end extending through the first end of the housing along a direction that is coaxial to the longitudinal axis of the housing, and
the inflow tube includes an inflow hole extending through a portion of the inflow tube between an interior of the inflow tube and an exterior of the inflow tube, the inflow hole extending in the first direction.

11. The apparatus of claim 1, wherein the freezing prevention assembly includes a reverse pressure regulator in the discharge tube, the reverse pressure regulator configured to constantly maintain a pressure within the enclosed space.

12. The apparatus of claim 1, wherein the freezing prevention assembly includes a heater in the vent line.

13. The apparatus of claim 1, wherein the container includes a process chamber in which a drying process is performed using the supercritical fluid.

14. The apparatus of claim 1, wherein the container includes a water supply tank configured to supply the supercritical fluid into a process chamber in which a drying process is performed using the supercritical fluid.

15. The apparatus of claim 1, further comprising:
a plurality of freezing prevention assemblies connected to each other in series.

16. A method for discharging a supercritical fluid from a container, the method comprising:
coupling a freezing prevention assembly to a vent line connected to the container, the vent line being configured to discharge the supercritical fluid, the freezing prevention assembly configured to at least partially restrict flow of the supercritical fluid through the vent line to mitigate a pressure drop in the vent line, the freezing prevention assembly including,
a housing configured to at least partially define an enclosed space, the housing extending along a longitudinal axis, the housing including a first end and an opposite second end;
at least one partition wall within the housing, the at least one partition wall extending in a first direction that is perpendicular to the longitudinal axis of the housing, the at least one partition wall is configured to partition the enclosed space into a plurality of spaces, the plurality of spaces including a first space that is proximate to the first end of the housing and a second space that is proximate to the second end of the housing;
an inflow tube extending through the first end of the housing, the inflow tube configured to direct the supercritical fluid into the first space; and
a discharge tube extending through the second end of the housing, the discharge tube configured to discharge the supercritical fluid from the second space;
wherein the at least one partition wall further includes a set of vent holes extending through the at least one partition wall, the set of vent holes defining a restricted fluid pathway between the first and second spaces, such that,
the at least one partition wall is configured to direct the supercritical fluid between adjacent spaces of the plurality of spaces through the restricted fluid pathway, and
the freezing prevention assembly is configured to direct the supercritical fluid in a non-linear progression path through the enclosed space between the inflow tube and the discharge tube, such that supercritical fluid flow through the enclosed space is restricted.

17. The method of claim 16, further comprising:
heating the supercritical fluid during the discharge of the supercritical fluid.

18. The method of claim 16, further comprising:
providing a sound absorption member in fluid communication with the supercritical fluid passing through the enclosed space, such that the sound absorption member is configured to absorb a noise generated from the supercritical fluid.

19. The method of claim 16, wherein the supercritical fluid is discharged from a process chamber in which a drying process is performed using the supercritical fluid.

20. The method of claim 16, wherein the supercritical fluid is discharged from a water supply tank for supplying the supercritical fluid into a process chamber in which a drying process is performed using the supercritical fluid.

21. An apparatus for treating a substrate, the apparatus comprising:
a process chamber in which a drying process is performed using a fluid which is provided as a supercritical fluid;
a storage tank configured to store the fluid;
a water supply tank configured to receive the fluid from the storage tank to produce the supercritical fluid and provide the supercritical fluid into the process chamber;
a vent line connected to at least one of the process chamber and the water supply tank, the vent line configured to discharge the supercritical fluid from at least the process chamber; and
a freezing prevention assembly disposed in the vent line, the freezing prevention assembly configured to at least partially restrict flow of the supercritical fluid through the vent line to mitigate a pressure drop in the vent line, the freezing prevention assembly including,
a housing configured to at least partially define an enclosed space, the housing extending along a longitudinal axis, the housing including a first end and an opposite second end;
at least one partition wall within the housing, the at least one partition wall extending in a first direction that is perpendicular to the longitudinal axis of the housing, the at least one partition wall is configured to partition the enclosed space into a plurality of spaces, the plurality of spaces including a first space that is proximate to the first end of the housing and a second space that is proximate to the second end of the housing;
an inflow tube extending through the first end of the housing, the inflow tube configured to direct the supercritical fluid into the first space; and
a discharge tube extending through the second end of the housing, the discharge tube configured to discharge the supercritical fluid from the second space;
wherein the at least one partition wall further includes a set of vent holes extending through the at least one partition wall, the set of vent holes defining a restricted fluid pathway between the first and second spaces, such that,
the at least one partition wall is configured to direct the supercritical fluid between adjacent spaces of the plurality of spaces through the restricted fluid pathway, and
the freezing prevention assembly is configured to direct the supercritical fluid in a non-linear progression path through the enclosed space between the inflow tube and the discharge tube, such that supercritical fluid flow through the enclosed space is restricted.

22. The apparatus of claim 21, wherein the freezing prevention assembly includes a sound absorption member configured to absorbing a noise generated from the supercritical fluid.

23. The apparatus of claim 21, wherein the freezing prevention assembly includes a heater configured to heat the supercritical fluid.

* * * * *